(12) United States Patent
Wu et al.

(10) Patent No.: US 12,125,727 B2
(45) Date of Patent: Oct. 22, 2024

(54) WAFER TRANSFER SYSTEM AND A METHOD FOR TRANSPORTING WAFERS

(71) Applicant: Taiwan Semiconductor Manufacturing Company, Ltd., Hsinchu (TW)

(72) Inventors: Ren-Hau Wu, New Taipei (TW); Cheng-Kang Hu, Kaohsiung (TW); Chieh-Chun Lin, Hsinchu (TW); Jia-Hong Liao, Hsinchu (TW); Cheng-Yi Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 153 days.

(21) Appl. No.: 17/894,862

(22) Filed: Aug. 24, 2022

(65) Prior Publication Data

US 2023/0326776 A1 Oct. 12, 2023

Related U.S. Application Data

(60) Provisional application No. 63/340,780, filed on May 11, 2022, provisional application No. 63/329,243, filed on Apr. 8, 2022.

(51) Int. Cl.
*H01L 21/677* (2006.01)
*H01L 21/673* (2006.01)

(52) U.S. Cl.
CPC .. *H01L 21/67724* (2013.01); *H01L 21/67389* (2013.01)

(58) Field of Classification Search
CPC ............... H01L 21/67724; H01L 21/67389
See application file for complete search history.

(56) References Cited

U.S. PATENT DOCUMENTS

| 6,196,001 B1 * | 3/2001 | Tannous | H01L 21/67724 |
| | | | 62/3.61 |
| 7,017,627 B2 * | 3/2006 | Chang | H01L 21/67017 |
| | | | 141/69 |

(Continued)

FOREIGN PATENT DOCUMENTS

JP 2000269294 A 9/2000
JP 2002203886 A 7/2002

(Continued)

*Primary Examiner* — Kaitlin S Joerger
(74) *Attorney, Agent, or Firm* — HAYNES AND BOONE, LLP

(57) ABSTRACT

A cart for wafer transportation includes a cart body, a separator disposed between first and second wafer holders, an airtight lock configured to seal the cart body. A wafer transfer system includes a cart including a space for holding a wafer holder, a first workstation configured to load the wafer holder into the space and pressurize the space, and a second workstation configured to depressurize the space and unload the wafer holder from the space, wherein the cart is transportable between the first workstation and the second workstation. A method for transporting wafers includes docking a cart in a workstation; loading a wafer holder into a space of the cart; pressurizing the space to cause a pressure of the space to be greater than an atmospheric pressure; maintaining the pressure of the space at the pressure; and moving the cart carrying the wafer holder away from the workstation.

20 Claims, 21 Drawing Sheets

(56) References Cited

U.S. PATENT DOCUMENTS

| | | | | |
|---|---|---|---|---|
| 2008/0076343 A1* | 3/2008 | Pyers | ................ | H01L 21/67724 |
| | | | | 454/141 |
| 2017/0011942 A1* | 1/2017 | Woo | .................. | H01L 21/67383 |
| 2017/0232988 A1* | 8/2017 | Bernier | ................... | B62B 3/005 |
| | | | | 280/47.35 |
| 2019/0206709 A1* | 7/2019 | Li | ..................... | H01L 21/67769 |
| 2021/0267104 A1* | 8/2021 | Lehner | ............... | H05K 13/0061 |

FOREIGN PATENT DOCUMENTS

| | | |
|---|---|---|
| TW | M244573 U | 9/2004 |
| TW | 201200445 A | 1/2012 |
| TW | 202008497 A | 2/2020 |

\* cited by examiner

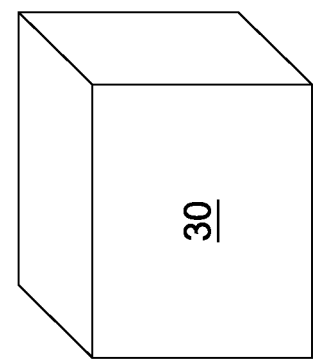
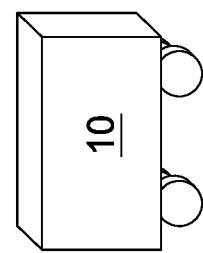
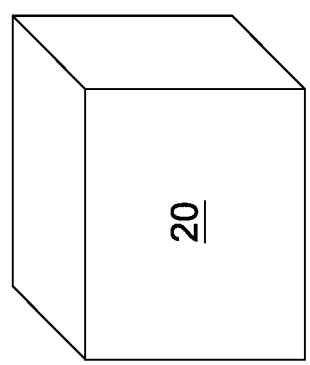
FIG. 8

WAFER TRANSFER SYSTEM AND A METHOD FOR TRANSPORTING WAFERS

PRIORITY CLAIM AND CROSS REFERENCE

This application claims the benefit of U.S. Provisional Application Ser. No. 63/329,243, filed on Apr. 8, 2022, and U.S. Provisional Application Ser. No. 63/340,780, filed on May 11, 2022, each of which is hereby incorporated by reference in its entirety.

BACKGROUND

During manufacture of a semiconductor device, the device is usually processed at many workstations or process tools. Transportation or conveyance of an unfinished device, or a work-in-process (WIP) part, is an important aspect of a total manufacturing process. Conveyance of WIP parts, e.g., semiconductor wafers, is especially important in a method of manufacturing integrated circuit (IC) chips due to the delicate nature of the chips. Furthermore, in fabricating an IC product, a large number of fabrication steps are usually required to complete the fabrication process. A semiconductor wafer must be stored or transported between various process stations in order to undergo various fabrication processes. Therefore, a method of wafer transportation must be effective and efficient.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 8 is a schematic illustration of a wafer transfer system in accordance with some embodiments of the present disclosure.

DETAILED DESCRIPTION

Figure 1:
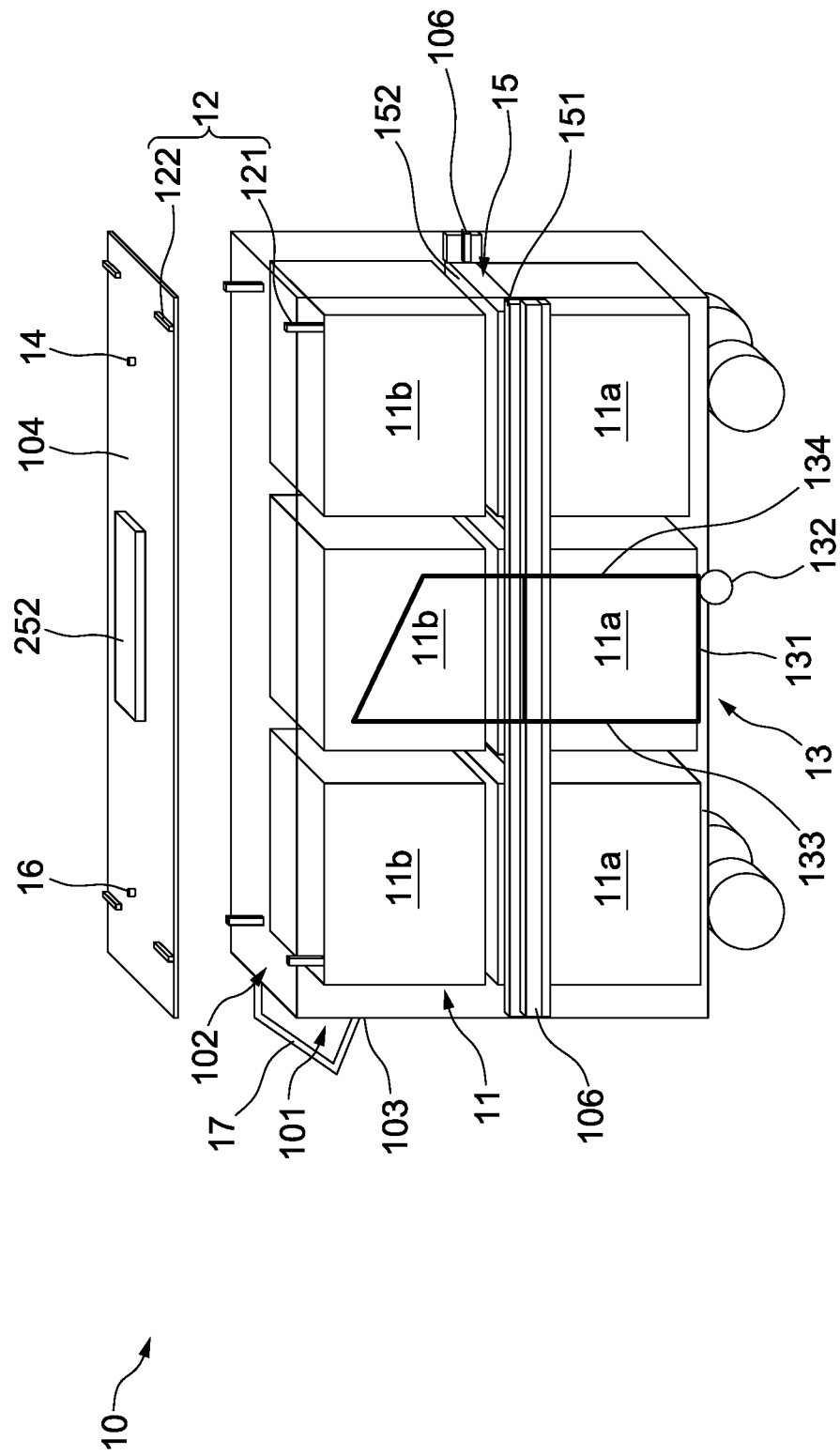
FIGS. 1 and 2 are schematic perspective views of a cart for wafer transportation in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, a cart for wafer transportation, a wafer transfer system and a method for transporting wafers are provided. In particular, the disclosure provides a cart configured to transport wafers, wherein the cart includes a cart body and an airtight lock configured to seal the cart body r. The disclosure also provides a wafer transfer system comprising the cart, a first workstation configured to load the wafer holder into the space and pressurize the space, and a second workstation configured to depressurize the space and unload the wafer holder from the space. In addition, a method for transporting wafers, including transporting the cart between the first workstation and the second workstation, is also provided below. Other features and processes may also be included. In the present disclosure, the space of the cart is pressurized and sealed in the first workstation to cause a pressure of the space of the cart to be greater than an atmospheric pressure during transportation of the wafer holder. The pressure of the space may cause a gas to be discharged if the space is leaking, thereby effectively preventing undesired substances, such as moisture, oxygen, particles, and the like from entering the space of the cart during the transportation.

The semiconductor industry often uses wafer holders to load wafers, and the wafer holders are often picked up and placed into a cart for transportation. In some existing wafer transfer systems, after the wafer is loaded into the wafer holder, the wafer holder is usually sealed in a bag before being put into the cart to prevent particles from entering the wafer holder during the transportation. The bag is single-use and has to be disposed of after use. The bag can be made of aluminum, antistatic material or plastic. Most wafer holders are placed into the bag manually. As the size of the wafer increases, the size of the wafer holder also increases, thereby increasing difficulty of placing the wafer holder in the bag.

Figure 2:
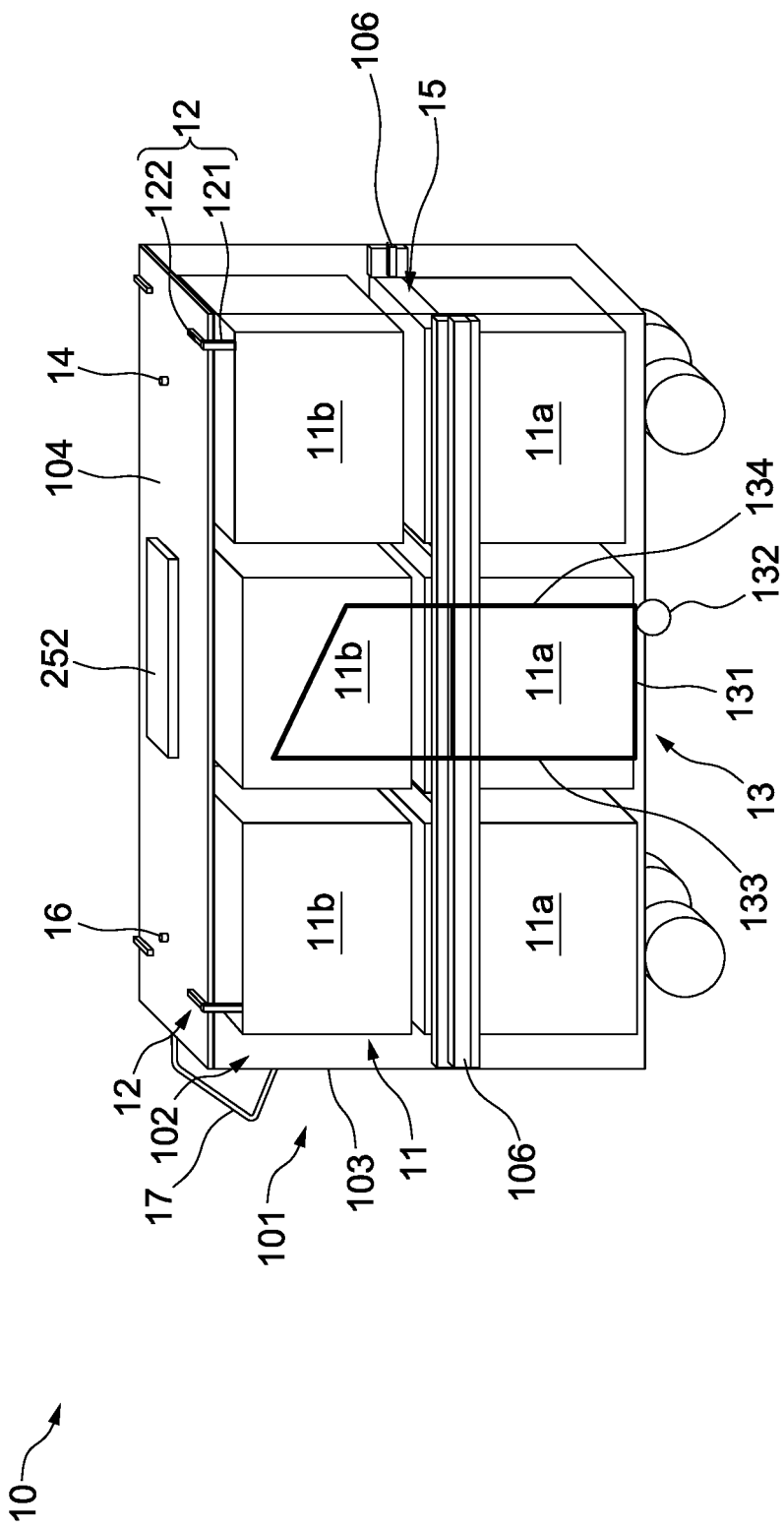

FIGS. 1 and 2 are schematic views of a cart 10 for wafer transportation according to aspects of the present disclosure in some embodiments. In some embodiments, referring to FIGS. 1 and 2, the cart 10 includes a cart body 101 including a sidewall 103 surrounding a space 102 and a lid 104 attachable to the sidewall 103, a first wafer holder 11a configured to carry wafers and disposed within the space 102, a second wafer holder 11b configured to carry wafers and disposed within the space 102. The cart 10 further includes a separator 15 disposed between the first wafer holder 11a and the second wafer holder 11b, and an airtight lock 12 configured to seal the cart body 101.

In some embodiments, the cart body 101 is configured to hold a plurality of wafer holders 11. The number of the wafer holders 11 may be adjusted according to requirements. FIGS. 1 and 2 illustrate only six of the wafer holders 11 for clarity and simplicity, but such example is intended to be illustrative only, and is not intended to be limiting to the embodiments. A person having ordinary skilled in the art would readily understand that any suitable number of the wafer holders 11 may be utilized, and all such combinations are fully intended to be included within the scope of the embodiments. In some embodiments, a plurality of wafers (not shown) are disposed in each of the wafer holders 11. In some embodiments, each wafer holder 11 may accommodate a different number of the wafers. Each of the wafer holders 11 may be a wafer cassette, a front opening unified pod (FOUP) or front opening shipping box (FOSB). In some embodiments, each of the wafer holders 11 is airtight. The wafer holders 11 may have similar structures or different structures in order to meet desired functional requirements.

In some embodiments, the wafer holders 11 include the first wafer holder 11a and the second wafer holder 11b. In some embodiments, a plurality of the first wafer holders 11a are disposed within the space 102 and arranged adjacent to each other. In some embodiments, the second wafer holder 11b is disposed over a corresponding first wafer holder 11a, and the separator 15 is disposed between the first wafer holder 11a and the second wafer holder 11b. In some embodiments, a plurality of the second wafer holders 11b are disposed within the space 102 and arranged adjacent to each other. In some embodiments, a plurality of the separators 15 are disposed within the space 102 and arranged between the corresponding first wafer holders 11a and the corresponding second wafer holders 11b.

In some embodiments, the separator 15 and the cart body 101 are independent of each other, and the separator 15 can be placed into or removed from the space 102 of the cart 10. In some embodiments, the cart body 101 is free of racks, and the space 102 is an open and undivided space.

Figure 3:
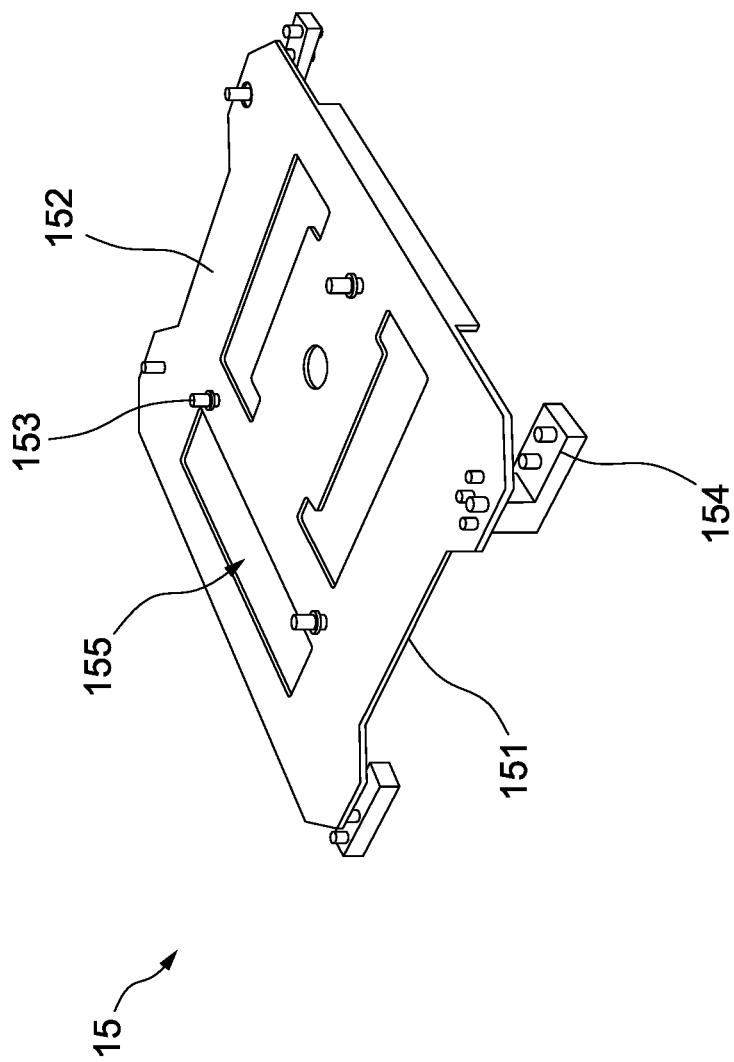
FIG. 3 is a schematic view of a separator of a cart for wafer transportation according to one embodiment of the present invention.

FIG. 3 is a schematic view of a separator 15 according to aspects of the present disclosure in some embodiments. In some embodiments, referring to FIGS. 1 to 3, the separator 15 is configured to secure the corresponding first wafer holder 11a and the corresponding second wafer holder 11b in the space 102. In some embodiments, the separator 15 is configured to absorb shocks and reduce vibrations experienced by the corresponding first wafer holder 11a and the corresponding second wafer holder 11b.

The separator 15 includes a first surface 151 and a second surface 152 opposite to the first surface 151. In some embodiments, the first surface 151 of the separator 15 secures the first wafer holder 11a. In some embodiments, the first surface 151 includes a buffer element (not shown) disposed thereon, and the first wafer holder 11a is in contact with the buffer element of the first surface 151. In some embodiments, the buffer element (not shown) is a top flange including elastic material or soft material. In some embodiments, the second surface 152 of the separator 15 secures the second wafer holder 11b. In some embodiments, the second surface 152 of the separator 15 includes a protrusion 153, and the second wafer holder 11b is in contact with the protrusion 153. In some embodiments, the second surface 152 of the separator 15 includes a plurality of protrusions 153, and the second wafer holder 11b is in contact with the protrusions 153. In some embodiments, the separator 15 includes guide pins 154, and the cart body 101 includes accommodating units 106 disposed within the space 102 and configured to receive the guide pins 154. In some embodiments, the guide pin 154 is disposed in the accommodating unit 106. In some embodiments, the separator 15 includes a through hole 155 extending through the first surface 151 and the second surface 152.

In some embodiments, referring back to FIGS. 1 and 2, the cart body 101 includes a sidewall 103 surrounding the space 102 and a lid 104 attachable to and detachable from the sidewall 103. In some embodiments, the sidewall 103 defines the space 102 configured to receive multiple wafer holders 11. In some embodiments, the lid 104 switches between an opened configuration and a closed configuration. When the lid 104 is in the opened configuration, the space 102 communicates with the outside environment. When the lid 104 is in the closed configuration, the lid 104 covers the sidewall 103 and the space 102, and the sidewall 103 and the lid 104 surround the space 102, and the space 102 is isolated from the outside environment.

In some embodiments, the cart body 101 is airtight, which may be achieved by sealing the gap between the lid 104 and the sidewall 103. In some embodiments, the cart 10 includes at least one airtight lock 12 configured to seal the cart body 101. In some embodiments, the airtight lock 12 is used to prevent separation of the sidewall 103 and the lid 104 during wafer transportation. In some embodiments, the airtight lock 12 includes a snib element 121 and a catch element 122 configured to engage with each other. In some embodiments, the snib element 121 protrudes from the sidewall 103, and the catch element 122 is disposed on the lid 104, but the disclosure is not limited thereto.

The position and number of the airtight locks 12 may be adjusted according to requirements, and are not particularly limited. In some embodiments, the cart 10 includes a plurality of airtight locks 12. In some embodiments, each corner of the lid 104 is provided with one airtight lock 12. In some embodiments, six airtight locks 12 are disposed at the periphery of the lid 104. Three of the six airtight locks 12 are disposed on each edge of the lid 104. In some embodiments, the airtight locks 12 are distributed around the periphery of the lid 104. The position and number of the snib elements 121 and the catch elements 122 may also be adjusted according to requirements, and are not particularly limited. In some embodiments, the position and number of the catch elements 122 correspond to the position and number of the snib elements 121. In an embodiment, the snib element 121 can be disposed at any suitable position on the sidewall 103, and the catch element 122 can be disposed at any suitable position on the lid 104. In some embodiments, the catch element 122 is disposed at a periphery of the lid 104. A subgroup of the plurality of airtight locks may be mechanically linked to be actuated at the same time.

Figure 4:
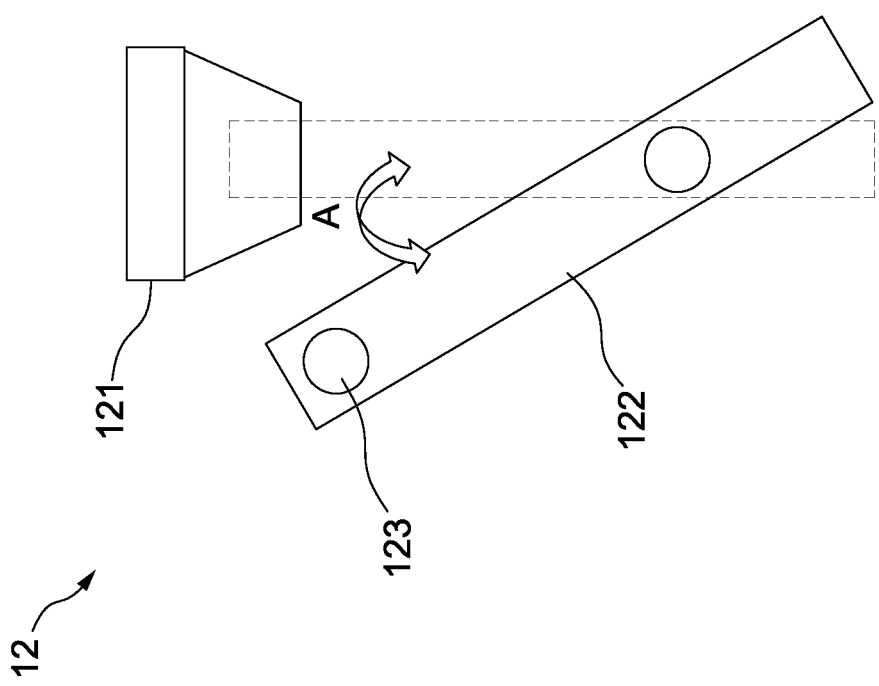
FIG. 4 is schematic top view of an airtight lock of a cart for wafer transportation according to one embodiment of the present invention.
Figure 5:
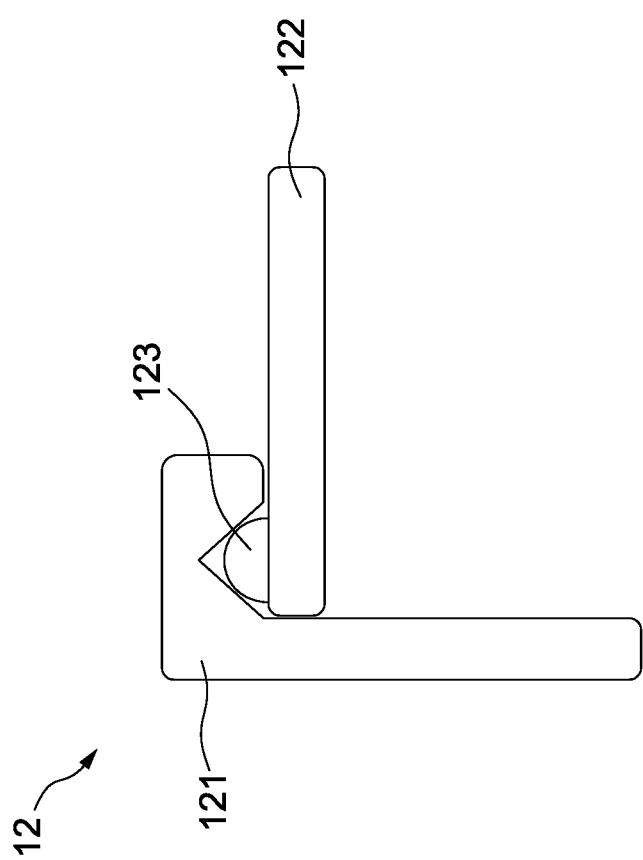
FIG. 5 is schematic illustration of an airtight lock of a cart for wafer transportation according to one embodiment of the present invention.

FIG. 4 is a schematic top view of an airtight lock 12 according to aspects of the present disclosure in some embodiments. FIG. 5 is a schematic side view of an airtight lock 12 according to aspects of the present disclosure in some embodiments. In some embodiments, referring to FIGS. 4 and 5, the snib element 121 and catch element 122 can be clamped to each other, thereby tightly engaging the sidewall 103 with the lid 104. In some embodiments, the snib element 121 is configured to receive the catch element 122, and the catch element 122 is receivable by the snib element 121. In some embodiments, the catch element 122 includes a protruded member 123, and the snib element 121 is configured to receive the protruded member 123.

In some embodiments, the airtight lock 12 can be in either of two states, i.e., a locked state and an unlocked state. In the unlocked state, the catch element 122 and the snib element 121 are separate from each other. FIG. 4 illustrates the airtight lock 12 in the unlocked state. In some embodiments, the catch element 122 is rotatable in a direction indicated by an arrow A and the airtight lock 12 can be switched between the two states. By rotation of the catch element 122, after the catch element 122 enters the snib element 121, the airtight lock 12 is changed from the unlocked state to the locked state.

FIG. 5 illustrates the airtight lock 12 in the locked state. In the locked state, the catch element 122 enters and locks with the snib element 121. In some embodiments, the protruded member 123 is received by the snib element 121 in the locked state. As a result, the airtight lock 12 is in the locked state, the lid 104 is tightly engaged with the sidewall 103 and the space 102 is sealed, and thus a pressure of the space 102 may be adjusted to and maintained at a predetermined pressure. The airtight lock 12 can be operated and controlled manually or automatically. The airtight lock 12 can be switched between the two states manually or automatically.

In some embodiments, referring back to FIGS. 1 and 2, the cart 10 includes a seal ring 105 configured to seal the space 102 of the cart body 101. In some embodiments, the seal ring 105 is disposed between the sidewall 103 and the lid 104. In some embodiments, the seal ring 105 is in contact with the sidewall 103 and the lid 104 when the lid 104 is in the closed configuration. In some embodiments, the seal ring 105 includes a flexible material.

In some embodiments, a gas inlet 14 is coupled to the cart body 101 and in communication with the space 102, and a valve (not shown) disposed at the gas inlet 14 and configured to control the injection of gas from a gas source (not shown) into the space 102 through the gas inlet 14. In some embodiments, the valve is a one-way valve that allows flow of gas into the space 102 but prohibits back flow of gas from the space 102 into the ambient. The one-way value helps hold positive pressure in the space 102 after pressurization. In some embodiments, the gas inlet 14 is disposed on the lid 104. In some embodiments, a gas may be pumped into the space 102 through the gas inlet 14 when the valve is opened after the lid 104 is closed. In some embodiments, the gas inlet 14 is configured to discharge the gas from the space 102 when the valve is opened. In some embodiments, the cart 10 further includes a gas outlet 16 for depressurizing the space 102. In some embodiments, the gas outlet 16 is coupled to the cart body 101. In some embodiments, the gas has a low reactivity to materials of the semiconductor wafers disposed in the wafer holder 11 and structures formed thereon. In some embodiments, the gas includes nitrogen, helium, neon, argon, krypton, xenon, radon, or a combination thereof. In some embodiments, the gas inlet 14 may be a nozzle with a quick connector or a quick connection function. The quick connection function allows quick connection and disconnection of a gas source to the space 102.

In some embodiments, the space 102 is an inert environment after the lid 104 is closed. Throughout the present disclosure, the term "inert environment" refers to an environment filled substantially with inert gases. The inert gas-filled environment may include a small percentage of other gases, such as clean air. In some embodiments, the space 102 filled with the inert gases is preferably airtight. In some embodiments, the space 102 has a positive pressure greater than an atmospheric pressure so that leakage, if any, will be in an outward direction. Undesired substances in an external environment cannot enter the cart 10, and the wafers and the integrated circuit structures formed thereon disposed within the wafer holder 11 are substantially free from adverse reaction with the undesired substances in the external environment.

In some embodiments, an anti-tipping device 13 is disposed on the cart body 101 and configured to switch between a deployed configuration and a retracted configuration. In some embodiments, the anti-tipping device 13 is disposed on the sidewall 103 of the cart body 101. In some embodiments, the anti-tipping device 13 is disposed on two opposite sides of the cart body 101. In some embodiments, the anti-tipping device 13 includes a bracket 131 and a safety wheel 132 attached to the bracket 131. In some embodiments, a first end 133 of the bracket 131 attaches to the cart body 101, and a second end 134 can be moved close to or away from the cart body 101. In some embodiments, the safety wheel 132 is disposed under the second end 134 of the bracket 131. When the cart 10 is tilted, the safety wheel 132 will contact the ground so that the cart 10 will not tip over. In some embodiments, a diameter of the safety wheel 132 is between 3 and 8 cm.

Figure 6:
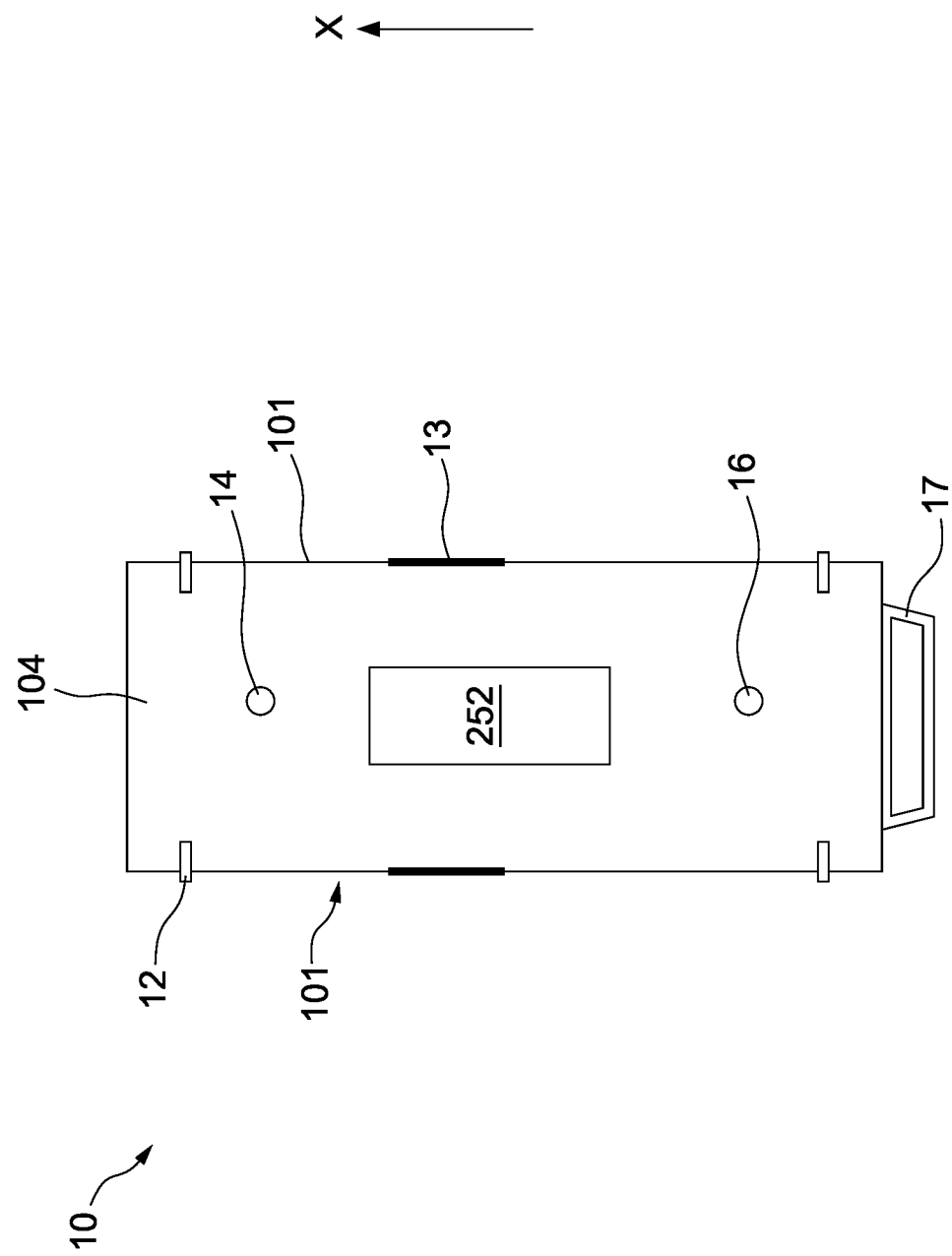
FIGS. 6 and 7 are schematic top views of a cart for wafer transportation in accordance with some embodiments of the present disclosure.
Figure 7:
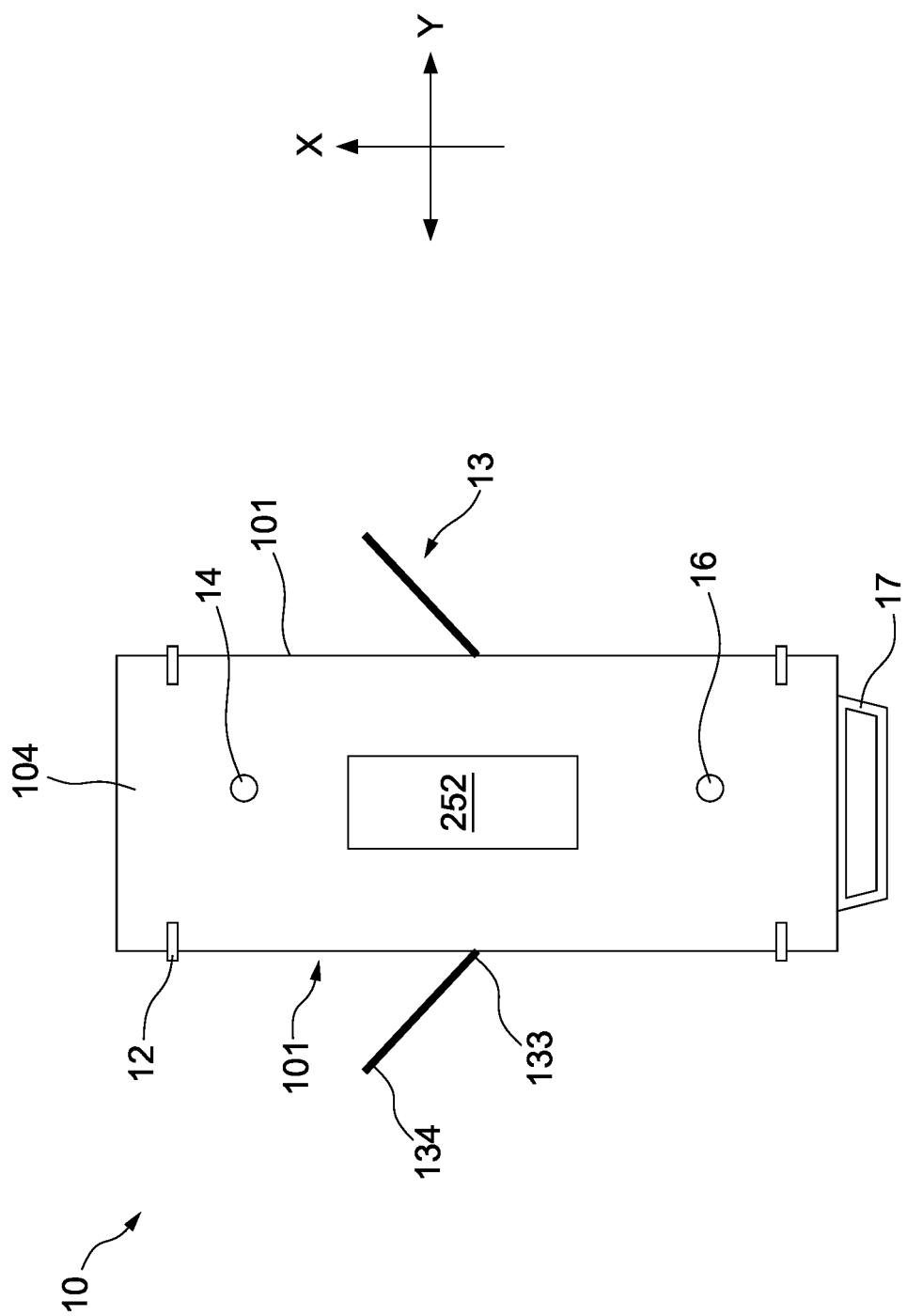

FIGS. 6 and 7 are schematic top views of a cart 10 according to aspects of the present disclosure in some embodiments. In some embodiments, referring to FIG. 6, the anti-tipping device 13 is in the retracted configuration, and the second end 134 of the bracket 131 is disposed adjacent to the cart body 101. In some embodiments, referring to FIG. 7, the anti-tipping device 13 is in the deployed configuration, and the second end 134 of the bracket 131 is away from the cart body 101. In some embodiments, when the cart moves along a first direction X, the anti-tipping device 13 extends towards a second direction Y perpendicular to the direction X. The anti-tipping device 13 can be operated and controlled manually or automatically. The anti-tipping device 13 can be switched between two configurations manually or automatically. In some embodiments, the cart 10 includes a handle 17 for the user to push the cart 10. In some embodiments, when the handle 17 is pushed, the anti-tipping device 13 switches to the deployed configuration.

In some embodiments, referring back to FIGS. 1 and 2, the cart 10 includes a plurality of sensors 252. In some embodiments, a plurality of sensors 252 are placed throughout the cart 10. In some embodiments, each of the sensors 252 is configured to sense at least one condition of the cart 10 (e.g., a position of the cart 10, a pressure of the space 102, a temperature of the space 102, a number of the wafer holders 11, a configuration of the lid 104, etc.). In some embodiments, at least one sensor 252 is installed on the lid 104. In some embodiments, at least one sensor 252 senses the pressure of the space 102. In some embodiments, the sensor 252 is configured to detect the processing condition and transmit a signal or data based on the detected processing condition to the central processor (not shown) for further analysis. FIG. 2 illustrates one sensor 252 for clarity and simplicity, but such example is intended to be illustrative only, and is not intended to be limiting to the embodiments. A person ordinarily skilled in the art would readily understand that any suitable number of the sensors 252 may be utilized. In some embodiments, a plurality of sensors 252 may have similar functions or different functions in order to meet the desired functional requirements.

FIG. 8 is a schematic view of a wafer transfer system 100 according to aspects of the present disclosure in some embodiments. In some embodiments, referring to FIG. 8, the wafer transfer system 100 includes the cart 10, a first workstation 20, and a second workstation 30. The cart 10 is transportable between the first workstation 20 and the second workstation 30. In some embodiments, the wafer transfer system 100 includes the cart 10 as illustrated in FIGS. 1 to 7. Further, FIG. 8 illustrates only the first workstation 20 and the second workstation 30 for clarity and simplicity, but such example is intended to be illustrative only, and is not intended to be limiting to the embodiments. A person ordinarily skilled in the art would readily understand that any suitable number of the workstations may be utilized, and all such combinations are fully intended to be included within the scope of the embodiments. Additionally, the first workstation 20 and the second workstation 30 are illustrated as having similar features; this is intended to be illustrative and is not intended to limit the embodiments, as the first workstation 20 and the second workstation 30 may have similar structures or different structures in order to meet the desired functional requirements. In some embodiments, the first workstation 20 and the second workstation 30 have similar structures.

Figure 9:
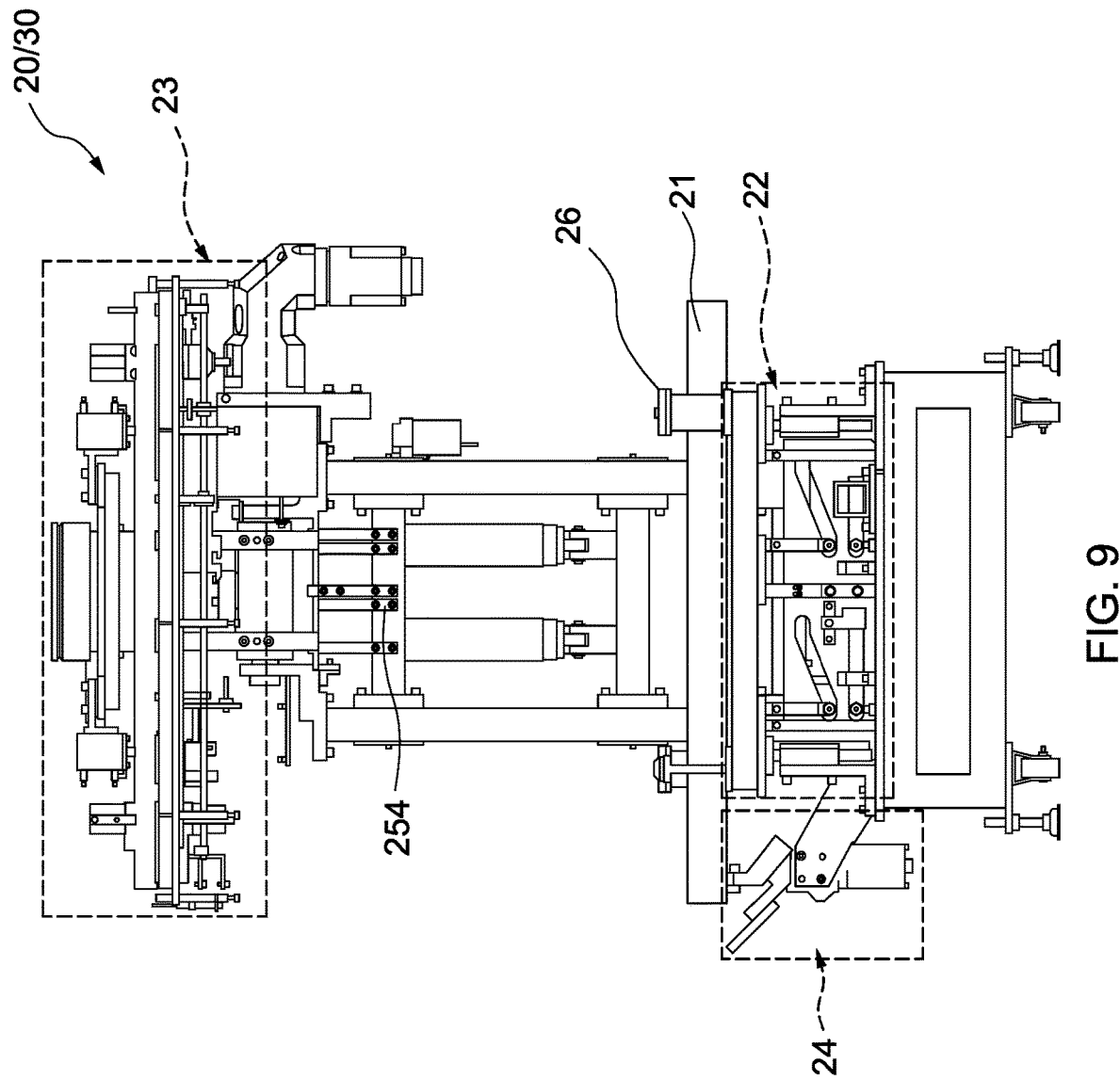
FIGS. 9 to 11 are schematic side views of one or more components of a wafer transfer system according to one embodiment of the present invention.
Figure 10:
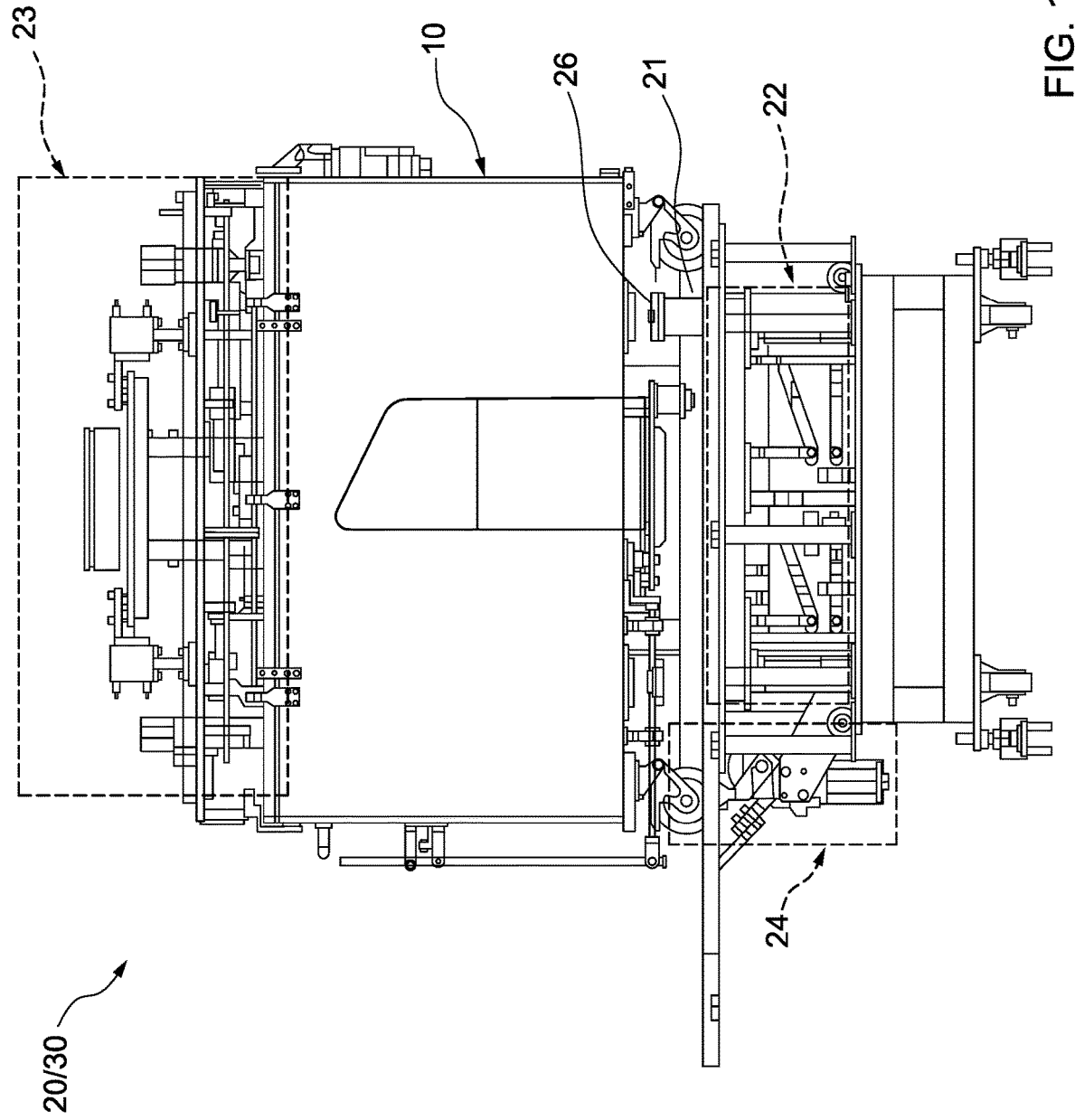
Figure 11:
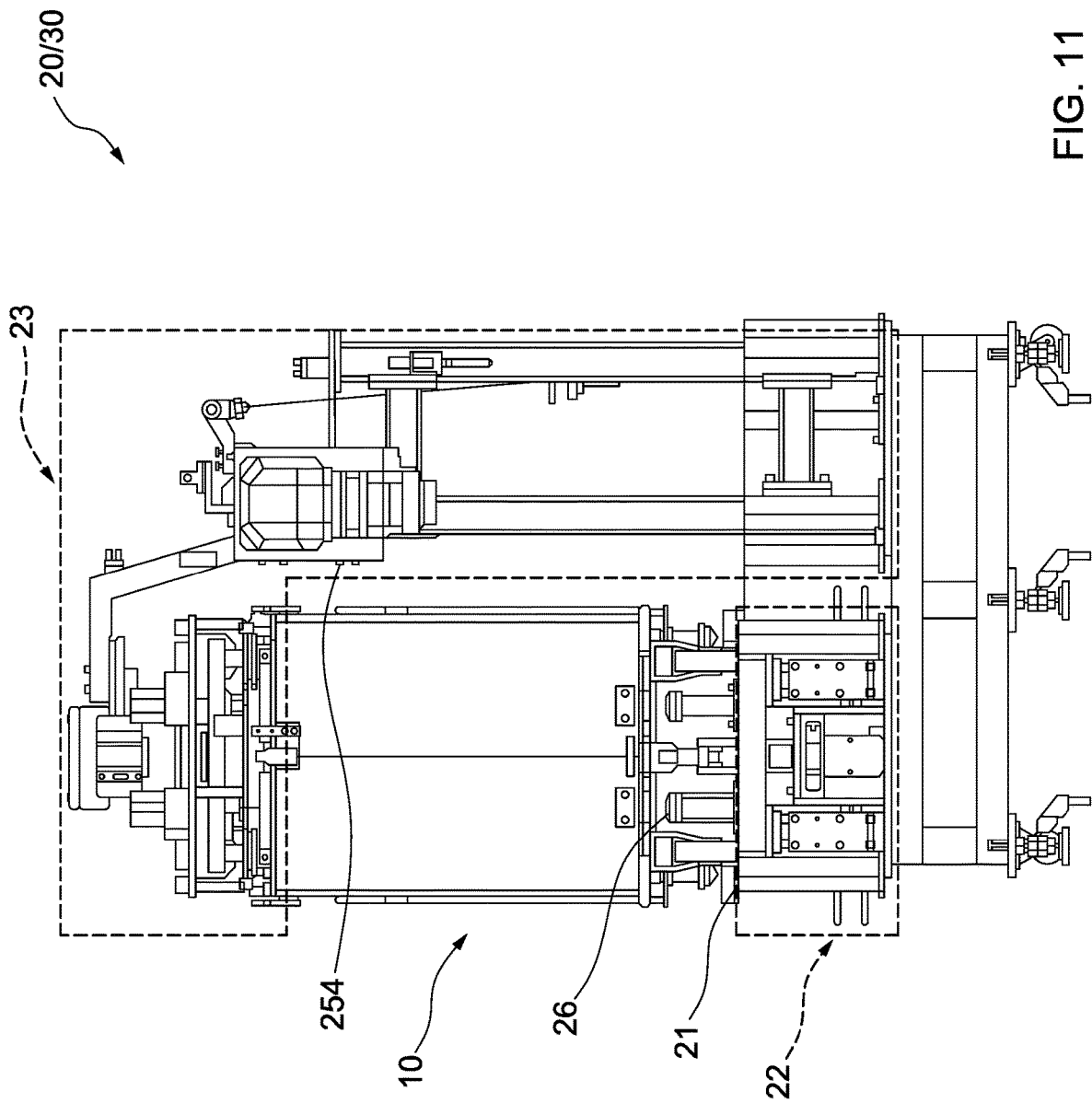
Figure 12:
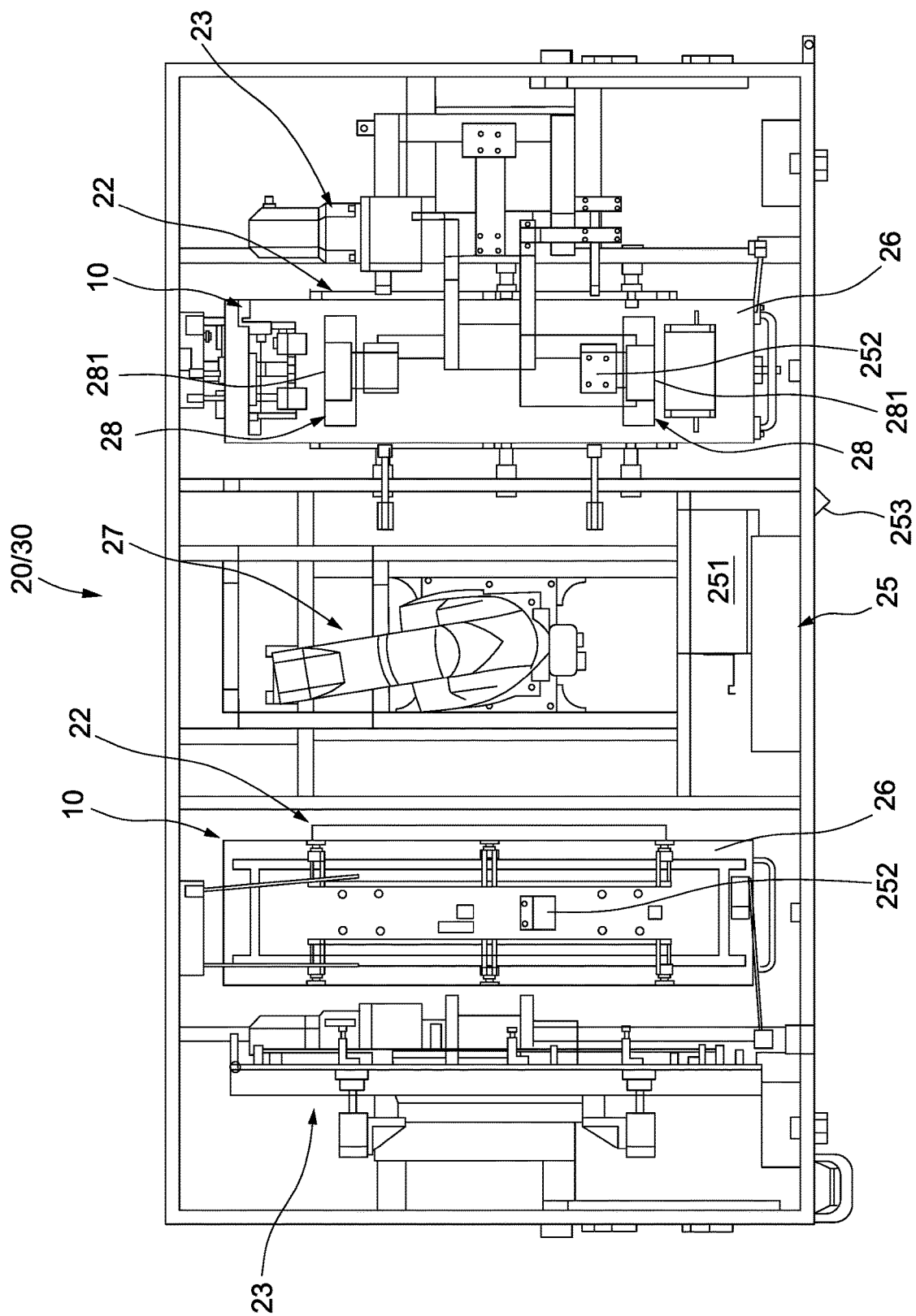
FIG. 12 is a schematic top view of one or more components of a wafer transfer system in accordance with some embodiments of the present disclosure.

FIGS. 9 to 11 are schematic side views of a workstation of a wafer transfer system 100 according to aspects of the present disclosure in some embodiments. FIG. 12 is a top view of a workstation of a wafer transfer system 100 according to aspects of the present disclosure in some embodiments. In some embodiments, referring to FIGS. 9 to 12, each of the first workstation 20 and the second workstation 30 is configured to load the wafer holder 11 into the space 102 and pressurize the space 102, or to depressurize the space 102 and unload the wafer holder 11 from the cart 10. In some embodiments, each of the first workstation 20 and the second workstation 30 includes a platform 21 configured for the cart 10 to be parked thereon.

In some embodiments, each of the first workstation 20 and the second workstation 30 includes a wheel guide 26 configured to guide the cart 10 to dock at a predetermined position. In some embodiments, the wheel guide 26 is disposed on the platform 21. In some embodiments, the wheel guide 26 protrudes from the platform 21. The wheel guide 26 prevents an undesired movement of the cart 10. In some embodiments, each of the first workstation 20 and the second workstation 30 includes a plurality of wheel guides 26. The number of the wheel guides 26 is not particularly limited. The positions of the wheel guides 26 are determined according to the predetermined position of the cart 10. In various embodiments, the wheel guides 26 have similar structures or different structures in order to meet the desired functional requirements. In some embodiments, the wheel guide 26 is disposed under the cart 10 when the cart 10 docked at the predetermined position.

In some embodiments, each of the first workstation 20 and the second workstation 30 includes a lid opening device 23 configured to open or close the lid 104 of the cart 10 and pressurize or depressurize the space 102. In some embodiments, the lid opening device 23 is configured to switch the lid 104 between the opened configuration and the closed configuration. In some embodiments, the lid opening device 23 pressurizes and depressurizes the space 102 through the gas inlet 14 and controls the pressure of the space 102. In some embodiments, the lid opening device 23 connects to a gas source (not shown). In some embodiments, the lid opening device 23 controls the airtight lock 12 and switches the airtight lock 12 between the locked state and the unlocked state. In some embodiments, the lid opening device 23 is electrically connected to the cart 10. The lid opening device 23 is operated manually or automatically.

In some embodiments, the lid opening device 23 is disposed on the platform 21, and the cart 10 is docked between the platform 21 and the lid opening device 23. In some embodiments, the lid opening device 23 is disposed adjacent to the cart 10. In some embodiments, the lid opening device 23 contacts the lid 104 when the cart 10 is docked at the predetermined position in the first workstation 20 or the second workstation 30.

In some embodiments, each of the first workstation 20 and the second workstation 30 includes a lifting mechanism 22 configured to lift the cart 10 when the cart 10 is docked in the first workstation 20 or the second workstation 30. In some embodiments, the lifting mechanism 22 is disposed under the platform 21 and is configured to raise or lower the platform 21. In some embodiments, the lifting mechanism 22 raises the cart 10 after the cart 10 enters the first workstation 20 or the second workstation 30 and stops on the platform 21. In some embodiments, the lifting mechanism 22 lowers the cart 10 after the space 102 is sealed. The lifting mechanism 22 operates manually or automatically. In some embodiments, a handle 24 disposed adjacent to the lifting mechanism 22 is configured to operate the lifting mechanism 22.

Figure 13:
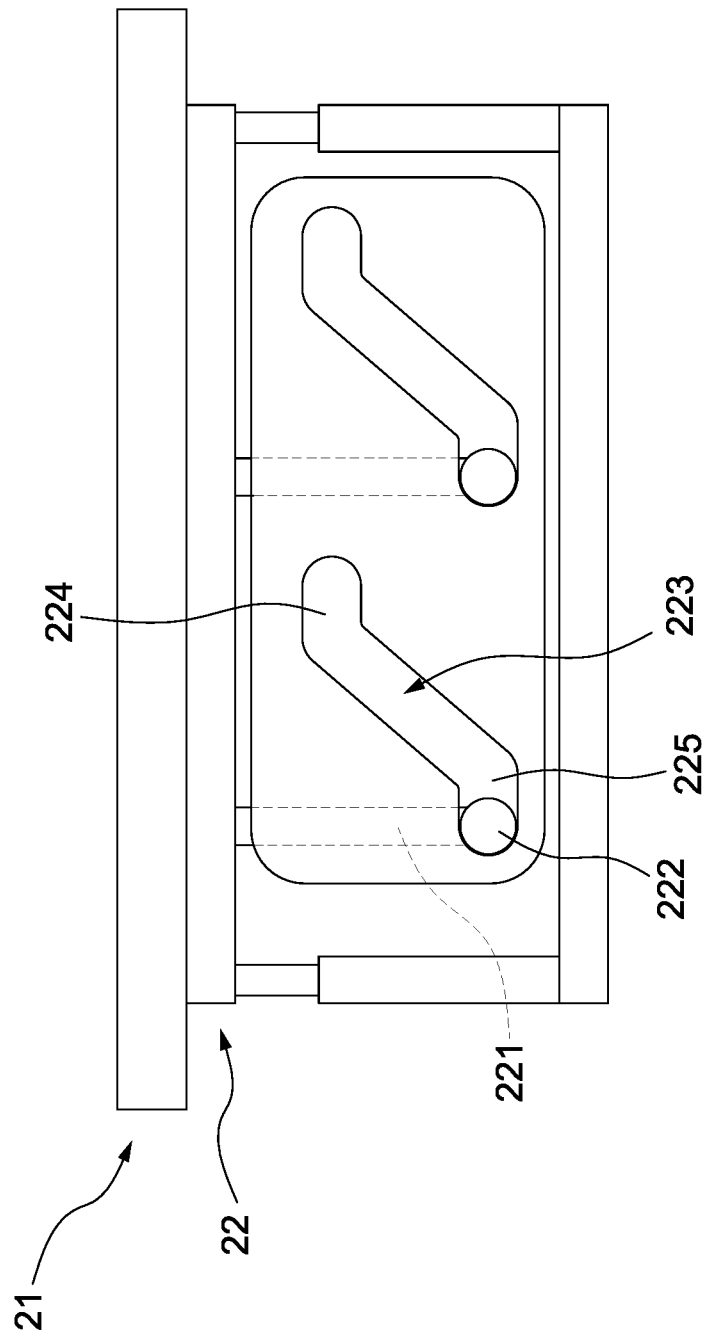
FIG. 13 is schematic side view of a platform and a lifting mechanism according to one embodiment of the present invention.

FIG. 13 is a schematic view of a portion of the first workstation 20 according to aspects of the present disclosure in some embodiments. In some embodiments, referring to FIG. 13, the lifting mechanism 22 includes a lifting bar 221. In some embodiments, the lifting bar 221 has an end part 222 movable within a slot 223 when the lifting bar 221 is lifted upwardly or moved downwardly. In some embodiments, the slot 223 is a Z path, so that the end part 222 of the lifting bar 221 is movable along the Z path. In some embodiments, the platform 21 is raised when the lifting bar 221 is moved upwardly and the end part 222 is moved along the slot 223. In some embodiments, the platform 21 is held at a raised position when the end part 222 arrives at an upper end 224 of the slot 223. That is, the end part 222 is locked at the upper end 224 of the slot 223 so that the platform 21 can be held at the raised position without external power or force. In some embodiments, the platform 21 is lowered when the lifting bar 221 is moved downwardly and the end part 222 is moved along the slot 223. In some embodiments, the platform 21 is returned to a lowered position as shown in FIG. 13 when the end part 222 arrives at a lower end 225 of the slot 223.

In some embodiments, referring back to FIGS. 9 to 12, the wafer transfer system 100 includes a monitoring system 25 configured to monitor the cart 10. The monitoring system 25 includes a central processor 251 disposed in the first workstation 20 or the second workstation 30 and the sensor 252 disposed on the cart 10 and electrically or wirelessly connected to the central processor 251. In some embodiments, the sensor 252 installed at the lid 104 of the cart 10 is configured to sense the pressure of the space 102, detect a conveying condition, and transmit a signal or data based on the detected conveying condition to the central processor 251 for further analysis. In some embodiments, the monitoring system 25 further includes a plurality of the sensors 254 placed around the first workstation 20 and the second workstation 30 of the wafer transfer system 100. In some embodiments, each of the sensors 254 is configured to sense at least one processing condition (e.g., the position of the cart 10, a distance between the lid opening device 23 and the lid 104, the number of the wafer holders 11 disposed in the cart 10, a state of the airtight lock 12, a condition of the gas inlet 14, a configuration of the anti-tipping device 13, etc.).

In some embodiments, the cart 10 includes a radio frequency identification (RFID) (not shown) disposed thereon, and the sensors 254 disposed in the first workstation 20 or the second workstation 30 are configured to sense the RFID of the cart 10 when the cart 10 is docked at the corresponding first workstation 20 or the second workstation 30. In some embodiments, the monitoring system 25 is configured to recognize the RFID detected by the sensors 254. In some embodiments, each of the first workstation 20 and the second workstation 30 includes a "cart in position" status lamp 253 configured to show whether the cart 10 is dock at the corresponding first workstation 20 or the second workstation 30. In some embodiments, when the sensor 254 disposed in the first workstation 20 or the second workstation 30 senses the RFID of the cart 10, the "cart in position" status lamp 253 is on.

In some embodiments, the monitoring system 25 is configured to process the pressure of the space 102 detected by the sensors 252, and configured to adjust a transportation condition of the cart 10 and a transfer speed of the cart 10. In some embodiments, the sensors 252 provide the pressure information of the space 102 to the central processor 251, and the central processor 251 adjusts the airtightness of the cart 10 in accordance with the pressure information. In some embodiments, the monitoring system 25 adjusts the conditions of the entry of the gas into the space 102 or the exit of the gas from the space 102 in real time in accordance with the pressure information. In some embodiments, the monitoring system 25 monitors the location of the cart 10 between the first workstation 20 and the second workstation 30. In some embodiments, the monitoring system 25 further monitors the conditions of the pressurizing and the depressurizing of the space 102 through the gas inlet 14. In some embodiments, the monitoring system 25, the first workstation 20 and the second workstation 30 are electrically or wirelessly connected. In some embodiments, the monitoring system 25, the lifting mechanism 22, the lid opening device 23, and the cart 10 are electrically or wirelessly connected. In some embodiments, each of the first workstation 20 and the second workstation 30 includes one central processor 251, and the central processors 251 electrically or wirelessly connect to each other.

In some embodiments, each of the first workstation 20 and the second workstation 30 includes a robotic arm 27 configured to load the wafer holder 11 into the space 102 of the cart 10 or to unload the wafer holder 11 from the space 102 of the cart 10. In some embodiments, each of the robotic arms 27 is configured to clamp the wafer holder 11 and the separator 15. In some embodiments, each of the robotic arms 27 is movable into or out of the space 102 of the cart 10.

In some embodiments, each of the robotic arms 27 is configured to dispose the separator 15 into the space 102 of the cart 10 or to unload the separator 15 from the space 102 of the cart 10. In some embodiments, each of the robotic arms 27 is configured to dispose the guide pin 154 of the separator 15 into the accommodating unit 106 of the space 102 of the cart 10 or to move the guide pin 154 of the separator 15 from the accommodating unit 106 of the space 102 of the cart 10. In some embodiments, the robotic arm 27 is disposed adjacent to the cart 10 when the cart 10 is docked in the first workstation 20 or the second workstation 30. In some embodiments, when the cart 10 is docked in the first workstation 20 or the second workstation 30, the cart 10 is disposed between the robotic arm 27 and the lid opening device 23. In some embodiments, the robotic arm 27 is disposed adjacent to the platform 21.

In some embodiments, referring to FIG. 12, each of the first workstation 20 and the second workstation 30 includes an image positioning system 28 configured to monitor whether the cart 10 is disposed at the predetermined position and/or whether the cart 10 is ready to load or unload. In some embodiments, the image positioning system 28 includes a camera 281 facing the platform 21. In some embodiments, the image positioning system 28 is disposed over the cart 10 when the cart 10 is docked in the first workstation 20 or the second workstation 30. In some embodiments, the image positioning system 28 is disposed between the cart 10 and the lid opening device 23 when the cart 10 is docked in the first workstation 20 or the second workstation 30. In some embodiments, the image positioning system 28 is disposed on the lid opening device 23. In some embodiments, the image positioning system 28 of each of the first workstation 20 and the second workstation is electrically or wirelessly connected to the corresponding monitoring system 25.

In some embodiments, each of the first workstation 20 and the second workstation 30 may dock a plurality of the carts 10. In some embodiments, each of the first workstation 20 and the second workstation 30 includes a plurality of the platforms 21, a plurality of the lifting mechanisms 22, a plurality of the lid opening devices 23, a plurality of the wheel guides 26, a plurality of the robotic arms 27, and a plurality of the image positioning systems 28. In some embodiments, the number of platforms 21 can be adjusted according to the number of the carts 10 to be docked. In some embodiments, each of the platforms 21 is configured with one of the lifting mechanisms 22, one of the lid opening devices 23, one of the wheel guides 26, and one of the robotic arms 27. In some embodiments, the robotic arm 27 is configured with a plurality of the platforms 21, and the plurality of the carts 10 docked at the first workstation 20 or the second workstation 30 can share one robotic arm 27. FIG. 12 illustrates two carts 10 for clarity and simplicity, but such example is intended to be illustrative only, and is not intended to be limiting to the embodiments. A person ordinarily skilled in the art would readily understand that any suitable number of the carts 10 may be utilized.

Figure 14:
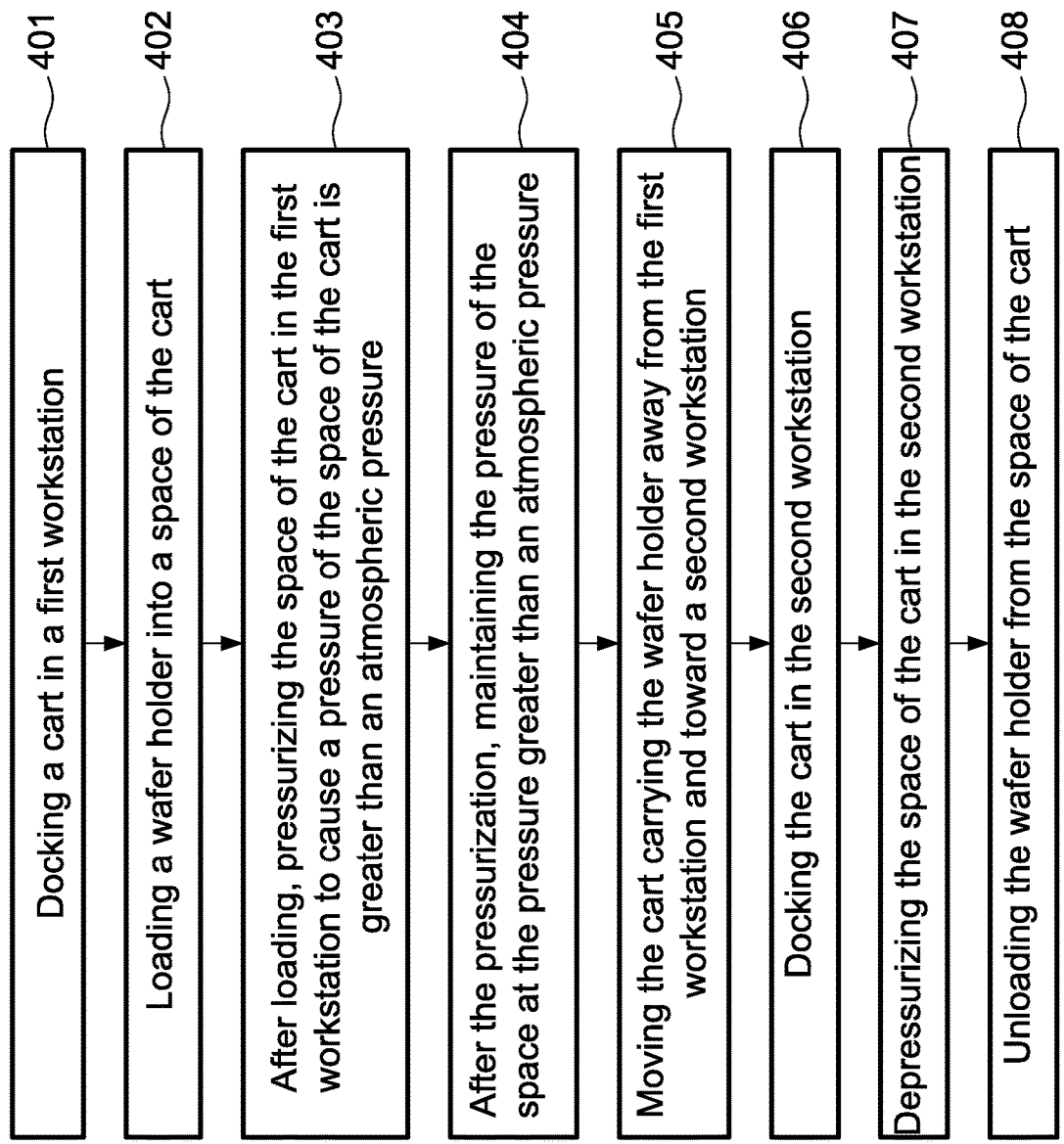
FIG. 14 is a flowchart of a method for transporting wafers in accordance with some embodiments of the present disclosure.

FIG. 14 is a flowchart of a method 400 for transporting wafers in accordance with some embodiments of the present disclosure. The method 400 includes several operations: (401) docking a cart in a first workstation; (402) loading a wafer holder into a space of the cart; (403) after loading, pressurizing the space of the cart to be greater than an atmospheric pressure; (404) after the pressurization, maintaining the pressure of the space at the pressure greater than an atmospheric pressure; (405) moving the cart carrying the wafer holder away from the first workstation toward a second workstation; (406) docking the cart in the second workstation; (407) depressurizing the space of the cart in the second workstation; and (408) unloading the wafer holder from the space of the cart.

Figure 15:
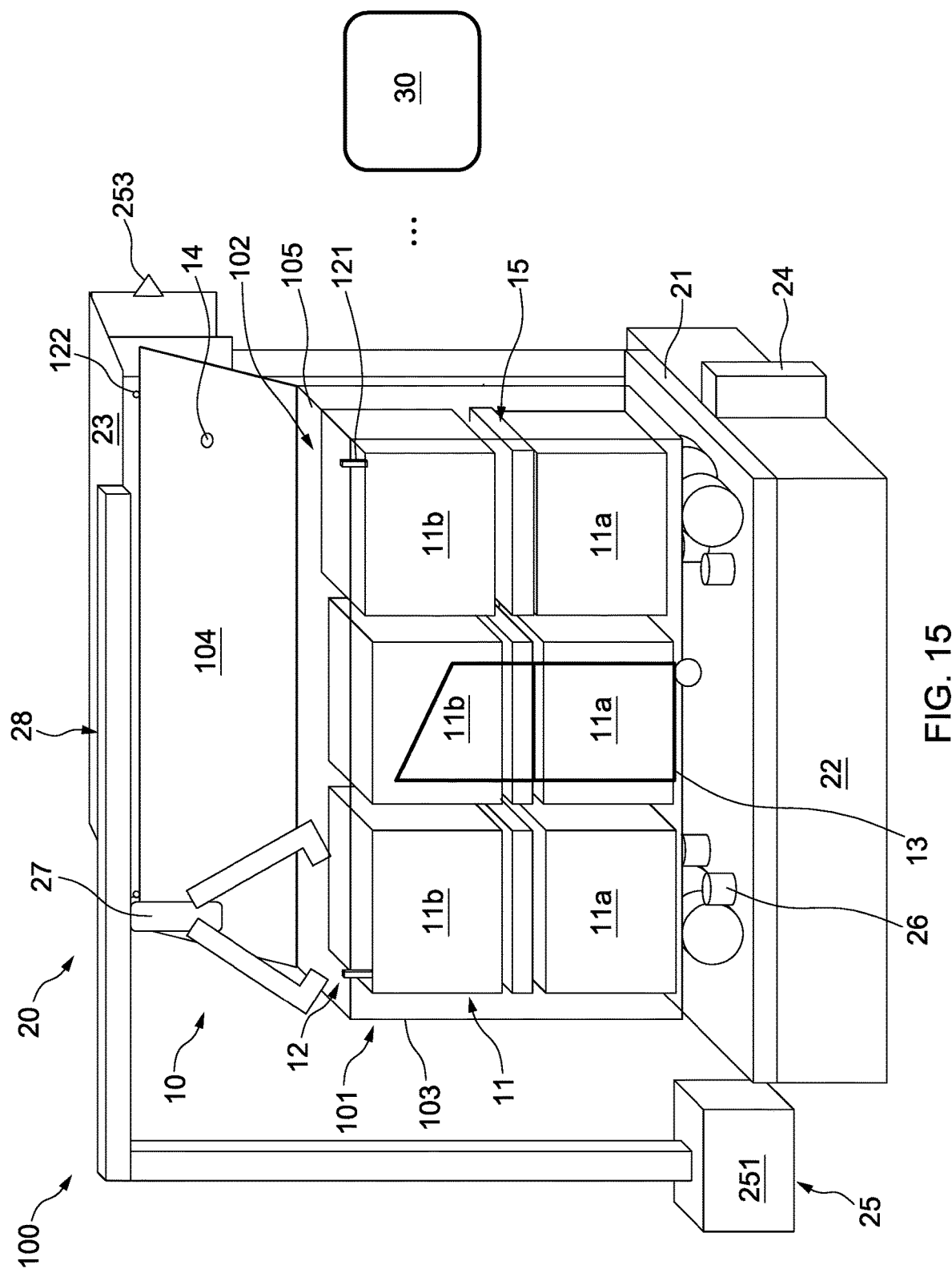
FIGS. 15 to 21 are schematic views of one or more stages of the method for transporting wafers in accordance with some embodiments of the present disclosure.

FIGS. 15 to 21 are schematic views of one or more stages of the method 400 for transporting wafers in accordance with some embodiments of the present disclosure. In some embodiments, the method 400 uses the cart 10 as illustrated in FIGS. 1 to 7 and the wafer transfer system 100 as illustrated in FIGS. 8 to 13. Referring to FIG. 15, in some embodiments, the wafer transfer system 100 including the cart 10, the first workstation 20, and a second workstation 30 is provided.

In operation 401, the cart 10 is docked in the first workstation 20. In some embodiments, the cart 10 is docked on a platform 21 in the first workstation 20. In some embodiments, the method 400 includes lifting the cart 10 in the first workstation 20 before the disposing of a wafer holder 11. In some embodiments, the cart 10 is lifted by a lifting mechanism 22 of the first workstation 20. In some embodiments, referring to FIG. 13, the lifting mechanism 22 is raised. In some embodiments, a lifting bar 221 is lifted upwardly. In some embodiments, an end part 222 of the lifting bar 221 moves from a lower end 225 of a slot 223 to an upper end 224 of the slot 223 along a Z path of the slot 223. In some embodiments, the end part 222 arrives at an upper end 224 of the slot 223, and the platform 21 is held at a raised position. In some embodiments, referring back to FIG. 15, a handle 24 may be activated by an operator to lift the cart 10 by the lifting mechanism 22. In some embodiments, the cart 10 is lifted in the first workstation 20 and a lid 104 of the cart 10 is opened by a lid opening device 23 of the first workstation 20. In some embodiments, a wheel guide 26 guides the cart 10 to a predetermined position in the first workstation 20. In some embodiments, an airtight lock 12 of the cart 10 is in an unlocked state. In some embodiments, an anti-tipping device 13 of the cart 10 is in a retracted configuration. In some embodiments, a monitoring system 25 monitors the cart 10. In some embodiments, the monitoring system 25 senses a RFID (not shown) of the cart 10. In some embodiments, since the cart 10 is dock at the first workstation 20, a "cart in position" status lamp 253 is on. In some embodiments, an image positioning system 28 monitors the cart 10 when the cart 10 is disposed on the platform 21. In some embodiments, the image positioning system 28 senses whether the cart 10 is ready to load.

In operation 402, the wafer holder 11 configured to carry wafers is loaded into a space 102 of the cart 10. In some embodiments, the wafer holder 11 is loaded into the space 102 by a robotic arm 27 of the first workstation 20. In some embodiments, the robotic arm 27 clamps the wafer holder 11 and reaches into the space 102. In some embodiments, a first wafer holder 11a is loaded within the space 102, a separator 15 is placed over the first wafer holder 11a, and a second wafer holder 11b is loaded over the separator 15. In some embodiments, a guide pin 154 of the separator 15 is received by an accommodating unit 106 of the cart 10. In some embodiments, the guide pin 154 of the separator 15 is secured within the space 102. In some embodiments, a plurality of the first wafer holders 11a are loaded within the space 102. In some embodiments, a plurality of the separators 15 are placed within the space 102 and over the corresponding first wafer holders 11a. In some embodiments, a plurality of the second wafer holders 11b are loaded within the space 102 and over the corresponding separators 15. In some embodiments, after loading the wafer holder 11, the robotic arm 27 moves away from the cart 10.

Figure 16:
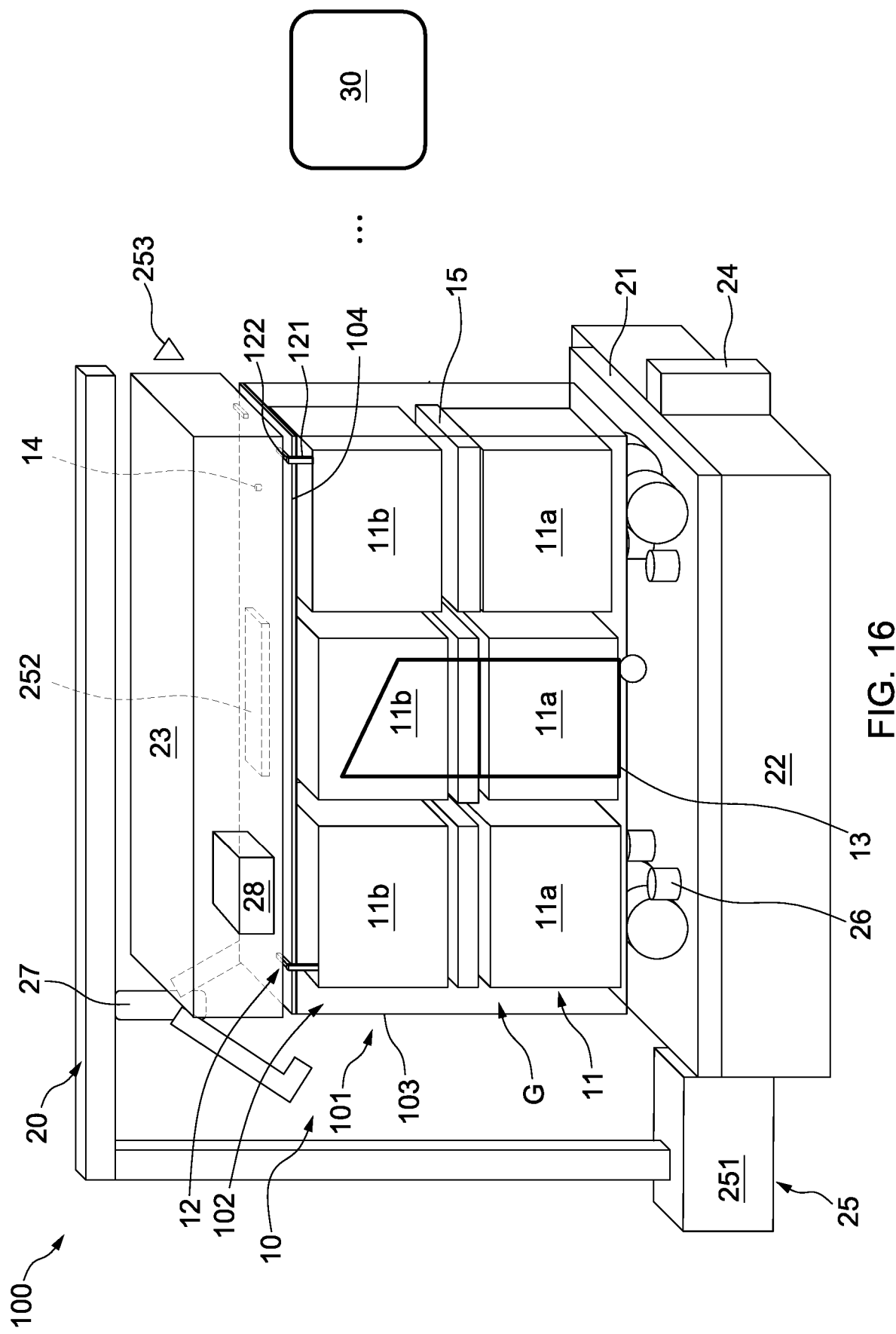

In some embodiments, referring to FIG. 16, the lid 104 is closed after the wafer holder 11 is disposed into the space 102 of the cart 10. In some embodiments, the space 102 is covered by the lid 104. In some embodiments, the lid 104 is closed by the lid opening device 23. In some embodiments, after the lid 104 is closed, the space 102 of the cart 10 is enclosed by a sidewall 103 and the lid 104. In some embodiments, after the lid 104 is closed, a seal ring 105 disposed between the lid 104 and the sidewall 103 of the cart 10 is in contact with the lid 104. In some embodiments, when the lid 104 is closed, the lid 104 is close to the sidewall 103 but does not seal the space 102, and the wafer holder 11 and the separator 15 cannot enter or exit the space 102 of the cart 10.

In some embodiments, an airtight lock 12 is switched from an unlocked state to a locked state to seal the space 102 after the lid 104 is closed. In some embodiments, the airtight lock 12 in the locked state applies a force to tightly engage the lid 104 and the sidewall 103 of a cart body 101, and thereby seals the space 102. In some embodiments, referring back to FIGS. 4 and 5, the method 400 includes engaging at least a portion of a catch element 122 with a snib element 121. In some embodiments, the method 400 includes rotating the catch element 122 along a direction A toward the snib element 121, and receiving a protruded member 123 by the snib element 121.

In operation 403, referring to FIG. 16, after the loading of the wafer holder 11 into the space 102, the space 102 of the cart 10 is pressurized in the first workstation 20. As a result of the pressurization, a pressure of the space 102 of the cart 10 is greater than an atmospheric pressure. In some embodiments, the space 102 of the cart 10 is pressurized through the gas inlet 14. In some embodiments, the space 102 of the cart 10 is pressurized by the lid opening device 23. In some embodiments, the cart 10 is docked at the predetermined position in the first workstation 20 during the pressurization of the space 102 of the cart 10.

In some embodiments, the pressurization of the space 102 includes increasing a pressure inside the space 102. In some embodiments, the positive pressure of the pressurized space 102 is greater than or equal to 1.3 atm. In some embodiments, a gas G is introduced into the space 102 of the cart 10. In some embodiments, the gas G includes an inert gas. In some embodiments, the method 400 includes sensing and monitoring the pressure inside the space 102 during the pressurization. In some embodiments, the sensor 252 senses and monitors the pressure inside the space 102 during the pressurization.

In operation 404, after the pressurization, the pressure of the space 102 is maintained at the pressure greater than an atmospheric pressure. In some embodiments, the space 102 is sealed before or after the pressurization. In some embodiments, the space 102 is sealed to maintain the space 102 at the pressure. In some embodiments, the valve disposed on the gas inlet 14 is closed after the pressurization of the space 102. In some embodiments, after the lid 104 is closed, the seal ring 105 is tightly engaged with the lid 104 and the sidewall 103 of the cart 10. In some embodiments, the space 102 is sealed by switching the airtight lock 12 from the unlocked state to the locked state after the lid 104 is closed. In some embodiments, the airtight lock 12 is under a stress after the pressurization of the space 102.

Figure 17:
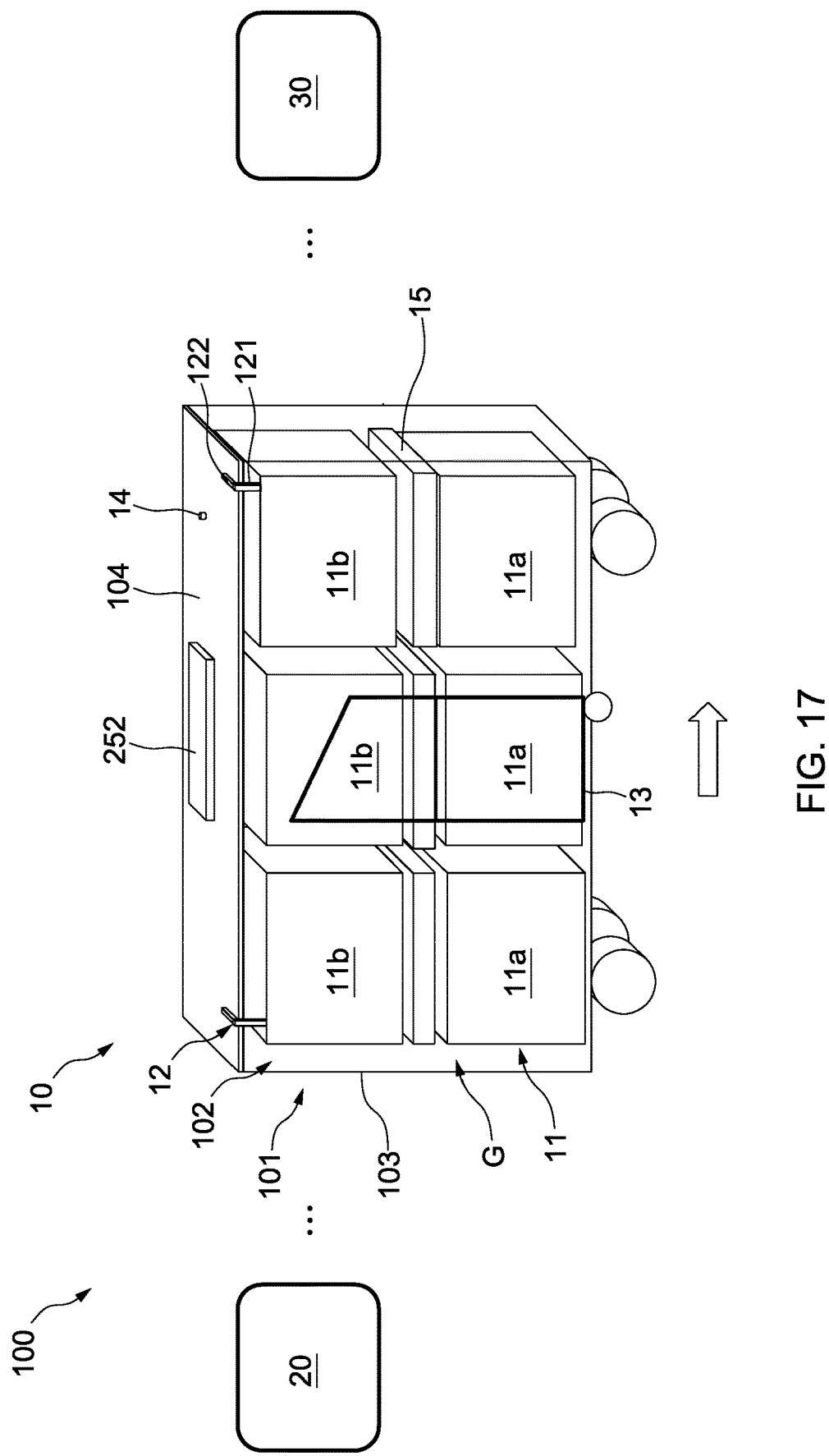
Figure 18:
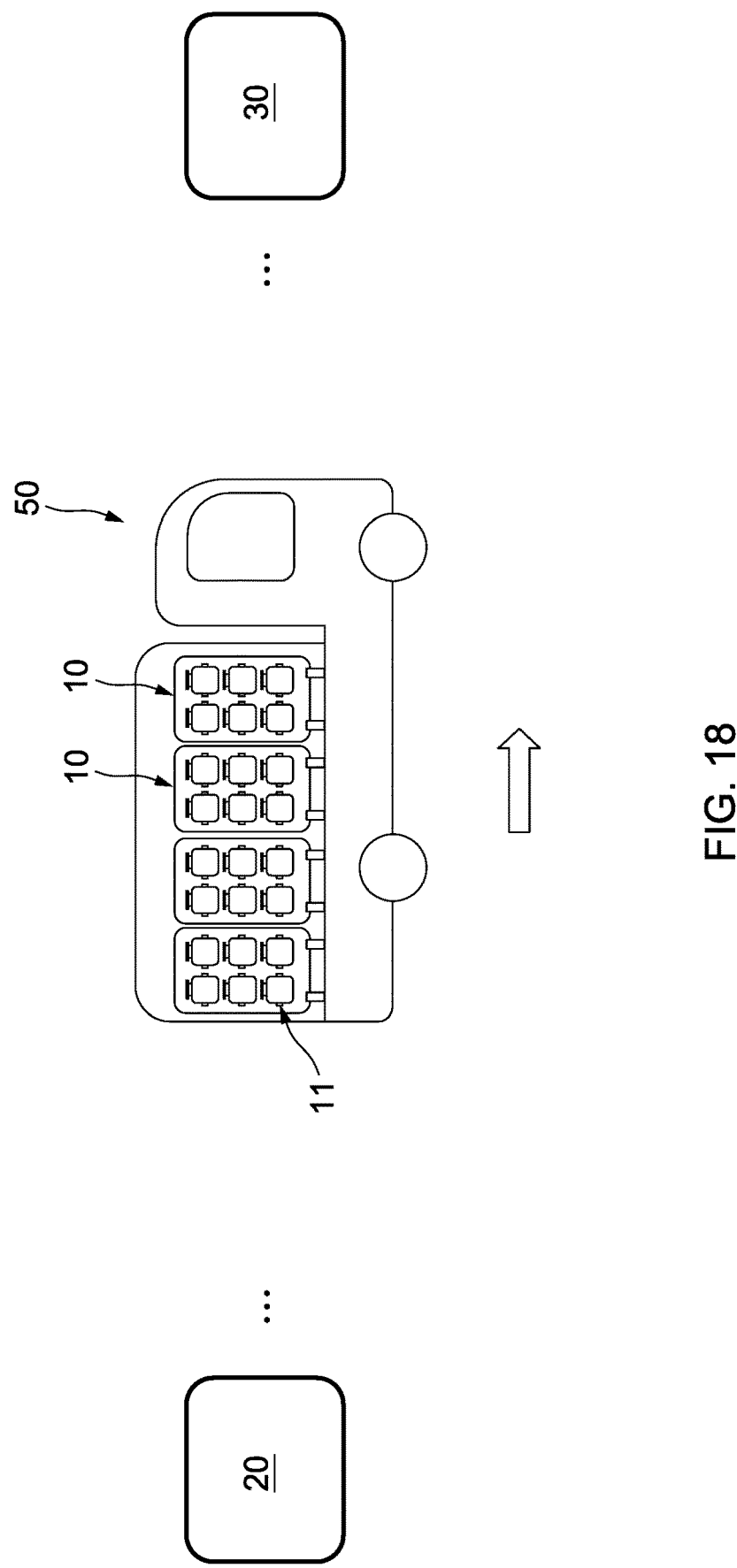

In operation 405, referring to FIG. 17, the method 400 includes moving the cart 10 carrying the wafer holder 11 away from the first workstation 20 and toward a second workstation 30. In some embodiments, the cart 10 moved away from the first workstation 20 and carries the first wafer holder 11a, the separator 15, and the second wafer holder 11b. In some embodiments, the cart 10 moves to the second workstation 30. In some embodiments, the pressure of the space 102 of the cart 10 during transportation is same as the pressure of the space 102 when the cart 10 is moved away the first workstation 20. In some embodiments, due to the fact that pressure of the space 102 of the cart 10 is greater than an atmospheric pressure, a gas flow (not shown) may flow from the space 102 towards the outside of the cart 10 if the gas G leaks from the space 102 or the airtight lock 12 is loosen during transportation. In some embodiments, if a portion of the gas G leaks from the space 102 and out of the cart 10 due to the pressure difference between the space 102 and the outside during transportation, the leaked gas G would form a gas barrier or an invisible shield to prevent contaminants such as dust flowing into the space 102.

In some embodiments, the method 400 includes separating the lid opening device 23 from the lid 104 after the space 102 is sealed. In some embodiments, the wheel guide 26 is retracted before the cart 10 leaves the first workstation 20. In some embodiments, the cart 10 is lowered by the lifting mechanism 22 before leaving the first workstation 20. In some embodiments, referring to FIG. 13, the method 400 further includes the returning the platform 21 to a lowered position as shown in FIG. 13 to lower the platform 21. In some embodiments, the lifting bar 221 is moved downwardly. In some embodiments, the end part 222 of the lifting bar 221 moves from the upper end 224 to the lower end 225 along the Z path of the slot 223. In some embodiments, referring back to FIG. 17, the method 400 includes deploying the anti-tipping device 13 disposed on the cart 10 during the movement of the cart away from the first workstation 20. In some embodiments, the anti-tipping device 13 of the cart 10 switches to a deployed configuration. In some embodiments, the method 400 includes pulling a handle 17 (as shown in FIGS. 6 and 7) of the cart 10 to deploy the anti-tipping device 13.

In some embodiments, the method 400 includes sensing and monitoring the pressure inside the space 102 during the movement of the cart 10. In some embodiments, the sensor 252 senses and monitors the pressure inside the space 102 during the movement of the cart 10. In some embodiments, the sensor 252 senses the pressure of the space 102 of the cart 10 and helps to maintain the pressure at a consistent level during the transportation. In some embodiments, when the sensor 252 senses that the pressure inside the space 102 is decreasing, at least a portion of the gas G leaks in an outward direction from the space 102, and undesired substances in an external environment cannot enter the cart 10. In some embodiments, when the sensor 252 senses that the pressure inside the space 102 is decreasing, a central processor 251 monitors location of the cart 10.

In some embodiments, the anti-tipping device 13 of the cart 10 is in the deployed configuration during transportation. In some embodiments, referring to FIG. 18, a truck 50 is configured to transport the cart 10. In some embodiments, a plurality of the carts 10 carrying the wafer holders 11 move to the truck and are loaded into the truck 50, and the truck 50 moves toward the second workstation 30. In some embodiments, the plurality of the carts 10 are unloaded from the truck 50 before moving into the second workstation 30.

Figure 19:
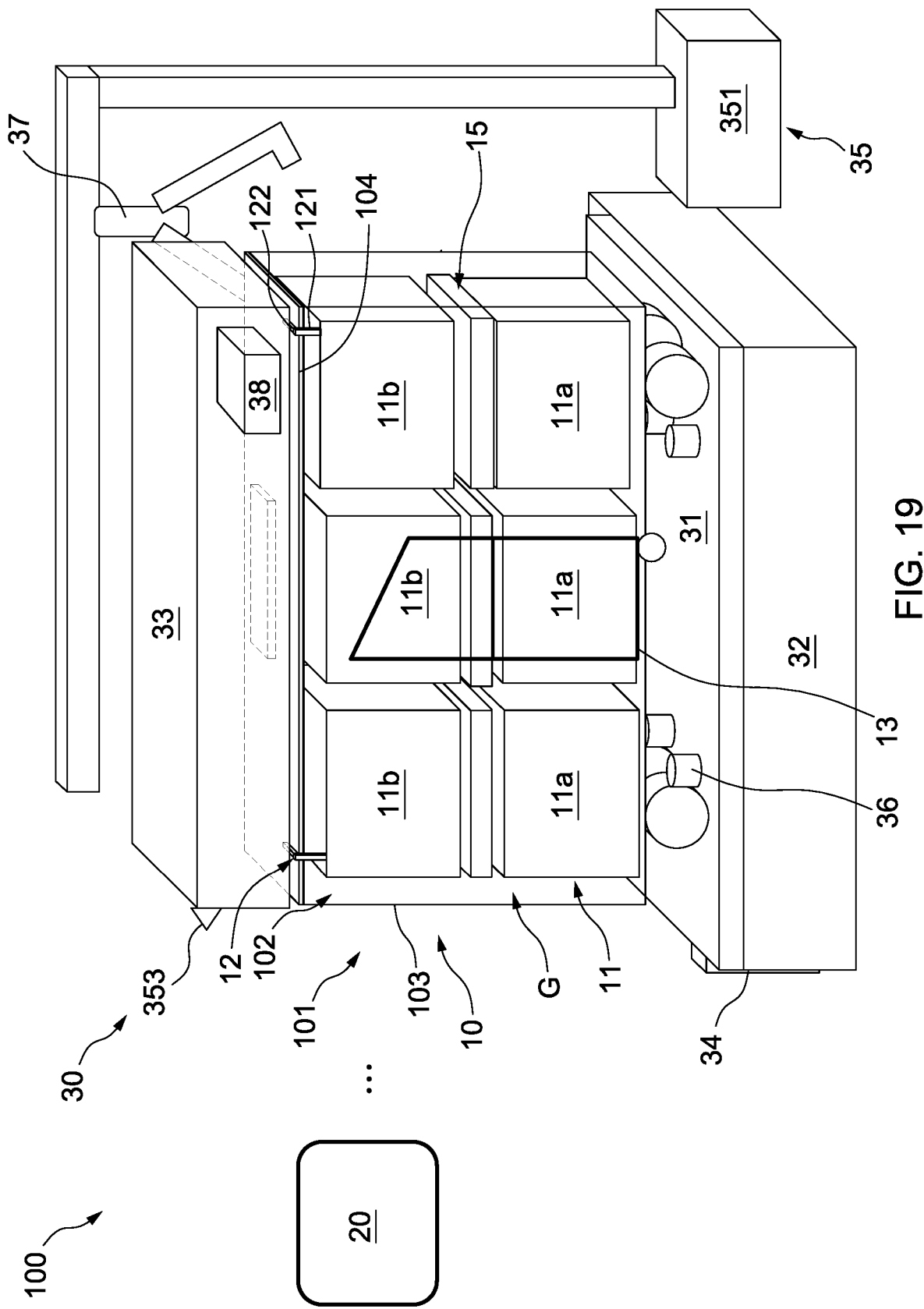

In operation 406, referring to FIG. 19, the method 400 includes docking the cart 10 in the second workstation 30. In some embodiments, the first workstation 20 and the second workstation 30 have similar features; this is intended to be illustrative and is not intended to limit the embodiments, as, in various embodiments, the first workstation 20 and the second workstation 30 have similar structures or different structures in order to meet desired functional requirements. In some embodiments, the cart 10 is docked on a platform 31 in the second workstation 30. In some embodiments, the method 400 includes lifting the cart 10 in the second workstation 30 before unloading the wafer holder 11. In some embodiments, the cart 10 is lifted by a lifting mechanism 32 of the second workstation 30. In some embodiments, a handle 34 of the second workstation 30 is pulled to cause the cart 10 to be lifted by the lifting mechanism 32. In some embodiments, the cart 10 is lifted in the second workstation 30 and a lid opening device 33 of the second workstation 30 is disposed over the lid 104. In some embodiments, a wheel guide 36 of the second workstation 30 guides the cart 10 to a predetermined position in the second workstation 30. In some embodiments, the method 400 includes retracting the anti-tipping device 13 at the second workstation 30 prior to the docking of the cart 10. In some embodiments, the anti-tipping device 13 of the cart 10 switches to the retracted configuration. In some embodiments, a monitoring system 35 monitors the cart 10 in the second workstation 30. In some embodiments, the monitoring system 35 senses the RFID (not shown) of the cart 10. In some embodiments, since the cart 10 is dock at the second workstation 30, and a "cart in position" status lamp 353 is on. In some embodiments, an image positioning system 38 monitors whether the cart 10 is disposed on the platform 31. In some embodiments, the image positioning system 38 senses whether the cart 10 is ready to unload.

In operation 407, the method 400 includes depressurizing the space 102 of the cart 10 in the second workstation 30. In some embodiments, the lid opening device 33 of the second workstation 30 contacts the lid 104. In some embodiments, the space 102 of the cart 10 is depressurized by the lid opening device 33.

In some embodiments, at least a portion of the gas G is released from the space 102 through the gas inlet 14 at the second workstation 30 before the lid 104 is opened. In some embodiments, the airtight lock 12 is switched from the locked state to the unlocked state before the lid 104 is opened. In some embodiments, referring back to FIGS. 4 and 5, the method 400 includes removing the portion of the catch element 122 away from the snib element 121. In some embodiments, the method 400 includes rotating the catch element 122 along the direction A away from the snib element 121, and moving the protruded member 123 away from the snib element 121.

Figure 20:
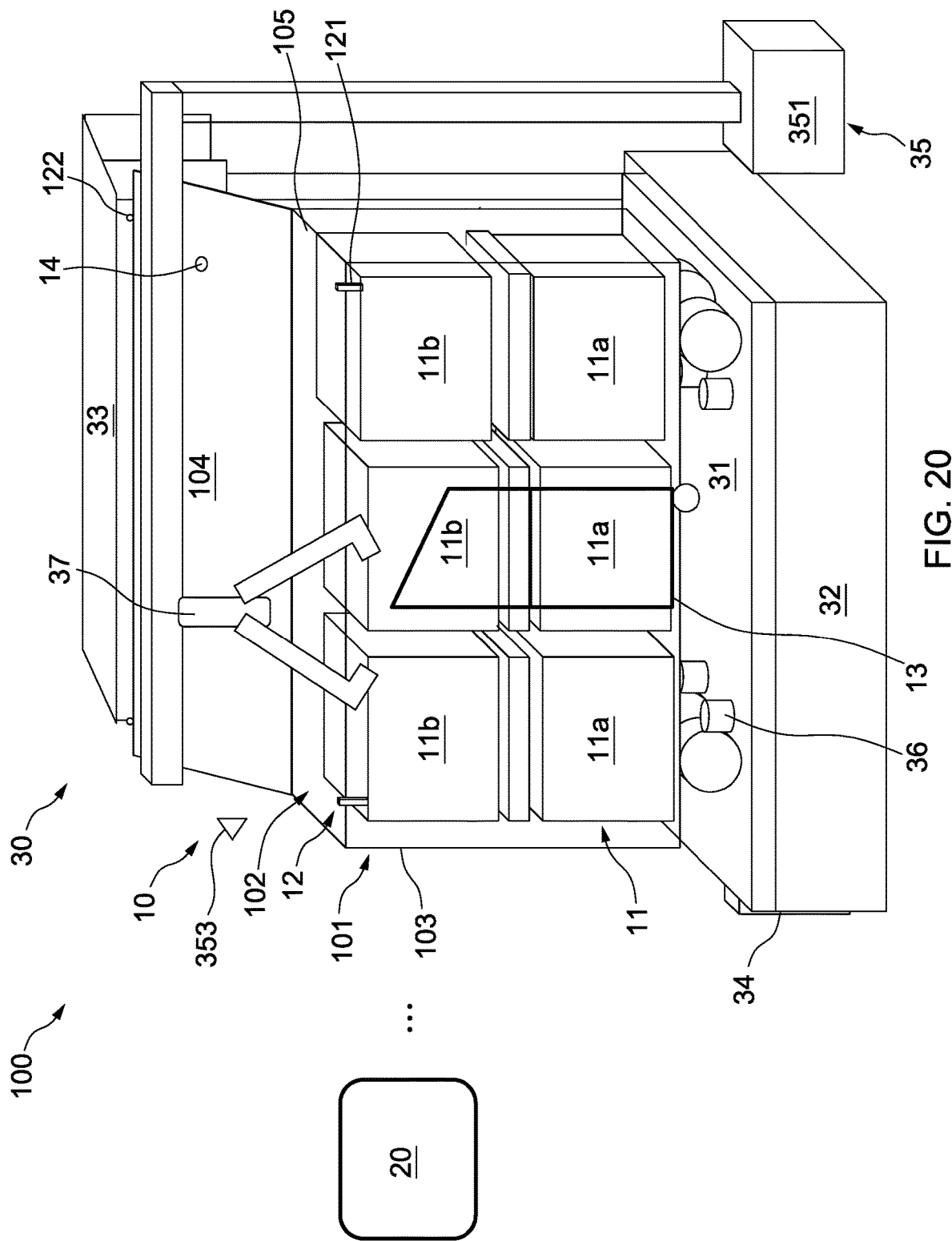

In some embodiments, referring to FIG. 20, the lid opening device 33 of the second workstation 30 opens the lid 104. In some embodiments, the wafer holder 11 and the separator 15 disposed in the space 102 are transported from the space 102 to the second workstation 30. In some embodiments, the pressure of the space 102 returns to the atmospheric pressure after the lid 104 is opened in the second workstation 30.

Figure 21:
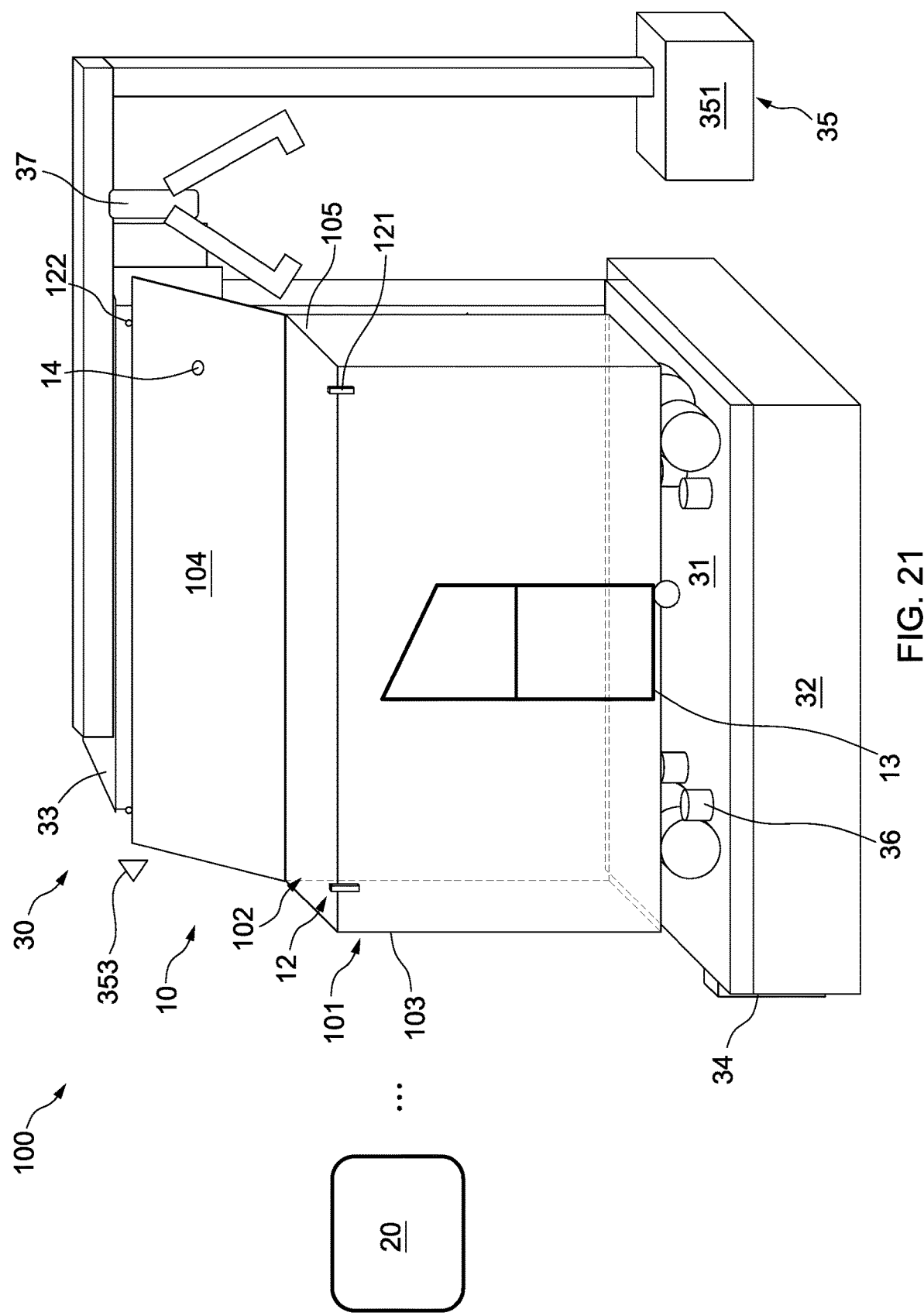

In operation 408, referring to FIGS. 20 and 21, the method 400 includes unloading the wafer holder 11 from the space 102 of the cart 10. In some embodiments, the wafer holder 11 is unloaded from the space 102 of the cart 10 in the second workstation 30. In some embodiments, the wafer holder 11 is picked up from the space 102 by a robotic arm 37 of the second workstation 30. In some embodiments, the robotic arm 37 of the second workstation 30 reaches into the space 102, clamps the wafer holder 11, and removes the wafer holder 11 from the cart 10. In some embodiments, the second wafer holder 11b, the separator 15 and the first wafer holder 11a are sequentially removed from the space 102 of the cart 10.

An aspect of the present disclosure relates to a cart for wafer transportation. The cart includes a cart body including a sidewall surrounding a space and a lid attachable to the sidewall, a first wafer holder configured to carry wafers and disposed within the space, and a second wafer holder configured to carry wafers and disposed within the space and over the first wafer holder. The cart further includes a separator disposed between the first wafer holder and the second wafer holder, and an airtight lock configured to seal the cart body. The separator and the cart body are independent of each other, and the airtight lock includes a snib element and a catch element configured to engage with each other, the snib element protrudes from the sidewall, and the catch element is disposed on the lid.

In some embodiments, the catch element includes a protruded member, and the snib element is configured to receive the protruded member. In some embodiments, the airtight lock includes a first element and a second element configured to engage with each other. The first element protrudes from the sidewall and the second element is disposed on the lid. In some embodiments, the cart further includes an anti-tipping device disposed on the cart body and configured to switch between a deployed configuration and a retracted configuration. In some embodiments, the cart further includes a gas inlet coupled to the cart body and in communication with the space, and a valve disposed at the gas inlet and configured to control the injection of gas from a gas source into the space through the gas inlet. In some embodiments, the cart body further includes a seal ring disposed between the sidewall and the lid.

An aspect of the present disclosure relates to a wafer transfer system. The wafer transfer system includes a cart configured to transport wafers and the cart includes a space for holding a first wafer holder carrying the wafers; a first workstation configured to load the first wafer holder into the space and pressurize the space; and a second workstation configured to depressurize the space and unload the first wafer holder from the space. The cart is transportable between the first workstation and the second workstation.

In some embodiments, the cart further includes a second wafer holder disposed in the space and over the first wafer holder, and a separator disposed between the first wafer holder and the second wafer holder, wherein the separator includes a buffer element disposed on a first surface and a protrusion protruding from a second surface opposite to the first surface. In some embodiments, the first workstation includes a lifting mechanism configured to lift the cart when the cart is docked in the first workstation. In some embodiments, the first workstation includes a lid opening device configured to open a lid of the cart. In some embodiments, the wafer transfer system further includes a monitoring system configured to monitor the cart, wherein the monitoring system includes a central processor and a sensor disposed on the cart and electrically or wirelessly connected to the central processor. In some embodiments, the first workstation includes a wheel guide configured to dock the cart in the first workstation.

An aspect of the present disclosure relates to a method for transporting wafers. The method includes docking a cart in a first workstation, loading a wafer holder into a space of the cart, and after the loading, pressurizing the space of the cart in the first workstation to cause a pressure of the space of the cart to be greater than an atmospheric pressure. The method further includes after the pressurization, maintaining the pressure of the space at the pressure greater than an atmospheric pressure, and moving the cart carrying the wafer holder away from the first workstation.

In some embodiments, wherein the space is sealed to maintain the space at the pressure. In some embodiments, the pressure is greater than or equal to 1.3 atm. In some embodiments, the method further includes sensing and monitoring a pressure inside the space during the movement of the cart. In some embodiments, the wafer holder is disposed into the space by a robotic arm at the first workstation. In some embodiments, the method further includes closing a lid of the cart after the disposing of the wafer holder into the space, and securing the lid of the cart to a cart body of the cart. In some embodiments, the method further includes lifting the cart in the first workstation before the disposing of the wafer holder.

In some embodiments, the method further includes providing a second workstation, moving the cart carrying the wafer holder in the space to the second workstation, docking the cart in the second workstation, depressurizing the space of the cart in the second workstation, and unloading the wafer holder from the space of the cart. In some embodiments, the method further includes deploying an anti-tipping device disposed on the cart during the moving of the cart away from the first workstation, and retracting the anti-tipping device at the second workstation prior to the docking of the cart.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cart for wafer transportation, comprising:
    a cart body including a sidewall surrounding a space and a lid attachable to the sidewall;
    a first wafer holder configured to carry wafers and disposed within the space;
    a second wafer holder configured to carry wafers and disposed within the space and over the first wafer holder;
    a separator disposed between the first wafer holder and the second wafer holder; and
    an airtight lock configured to seal the cart body,
    wherein the separator and the cart body are independent of each other, and the airtight lock includes a snib element and a catch element configured to engage with each other, the snib element protrudes from the sidewall, and the catch element is disposed on the lid.

2. The cart of claim 1, wherein the catch element includes a protruded member, and the snib element is configured to receive the protruded member.

3. The cart of claim 1, further comprising
    an anti-tipping device disposed on the cart body and configured to switch between a deployed configuration and a retracted configuration.

4. The cart of claim 1, further comprising:
    a gas inlet coupled to the cart body and in communication with the space; and
    a one-way valve disposed at the gas inlet and configured to control injection of gas from a gas source into the space through the gas inlet.

5. The cart of claim 1, wherein the cart body further includes a seal ring disposed between the sidewall and the lid.

6. A wafer transfer system, comprising:
    a cart configured to transport wafers, wherein the cart includes a space for holding a first wafer holder carrying the wafers;
    a first workstation configured to load the first wafer holder into the space and pressurize the space; and
    a second workstation configured to depressurize the space and unload the first wafer holder from the space,
    wherein the cart is transportable between the first workstation and the second workstation.

7. The wafer transfer system of claim 6, wherein the cart further includes a second wafer holder disposed in the space and over the first wafer holder, and a separator disposed between the first wafer holder and the second wafer holder, wherein the separator includes a buffer element disposed on a first surface, and a protrusion protruding from a second surface opposite to the first surface.

8. The wafer transfer system of claim 6, wherein the first workstation includes a lifting mechanism configured to lift the cart when the cart is docked in the first workstation.

9. The wafer transfer system of claim 6, wherein the first workstation includes a lid opening device configured to open a lid of the cart.

10. The wafer transfer system of claim 6, further comprising:
    a monitoring system configured to monitor the cart, wherein the monitoring system includes a central processor and a sensor disposed on the cart, wherein the sensor is electrically or wirelessly connected to the central processor.

11. The wafer transfer system of claim 6, wherein the first workstation includes a wheel guide configured to dock the cart in the first workstation.

12. A method for transporting wafers, comprising:
    docking a cart in a first workstation;
    loading a wafer holder into a space of the cart;
    after the loading, pressurizing the space of the cart in the first workstation to cause a pressure of the space of the cart to be greater than an atmospheric pressure;
    after the pressurization, maintaining the pressure of the space at the pressure greater than an atmospheric pressure; and
    moving the cart carrying the wafer holder away from the first workstation.

13. The method of claim 12, wherein the space is sealed to maintain the space at the pressure.

14. The method of claim 12, wherein the pressure is greater than or equal to 1.3 atm.

15. The method of claim 12, further comprising:
    sensing and monitoring the pressure inside the space during the moving of the cart.

16. The method of claim 12, wherein the wafer holder is loaded into the space by a robotic arm at the first workstation.

17. The method of claim 12, further comprising:
    closing a lid of the cart after the loading of the wafer holder into the space; and
    securing the lid of the cart to a cart body of the cart.

18. The method of claim 12, further comprising:
    lifting the cart in the first workstation before the loading of the wafer holder.

19. The method of claim 12, further comprising:
    moving the cart carrying the wafer holder in the space to a second workstation;
    docking the cart in the second workstation;
    depressurizing the space of the cart in the second workstation; and
    unloading the wafer holder from the space of the cart.

20. The method of claim 19, further comprising:
    deploying an anti-tipping device disposed on the cart during the moving of the cart away from the first workstation; and
    retracting the anti-tipping device at the second workstation prior to the docking of the cart.

* * * * *